(12) United States Patent
Yamazaki

(10) Patent No.: US 7,247,512 B2
(45) Date of Patent: Jul. 24, 2007

(54) LIGHT EMITTING DEVICE AND METHOD OF MANUFACTURING THE SAME

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 157 days.

(21) Appl. No.: 11/029,425

(22) Filed: Jan. 6, 2005

(65) Prior Publication Data

US 2005/0118745 A1 Jun. 2, 2005

Related U.S. Application Data

(62) Division of application No. 10/191,517, filed on Jul. 10, 2002, now Pat. No. 6,844,672.

(30) Foreign Application Priority Data

Jul. 11, 2001 (JP) ............................. 2001-211454
Apr. 24, 2002 (JP) ............................. 2002-122446

(51) Int. Cl.
*H01L 51/40* (2006.01)
(52) U.S. Cl. ................. 438/99; 257/E21.007
(58) Field of Classification Search ............... 438/99; 257/E21.007
See application file for complete search history.

(56) References Cited

U.S. PATENT DOCUMENTS

| 6,445,005 | B1 | 9/2002 | Yamazaki et al. |
| 6,608,449 | B2 | 8/2003 | Fukunaga |
| 2001/0017517 | A1 | 8/2001 | Yamazaki |
| 2004/0251826 | A1* | 12/2004 | Schlenker .................. 313/512 |

FOREIGN PATENT DOCUMENTS

| EP | 1 085 576 A2 | 3/2001 |
| JP | 2001-319789 | 11/2001 |

* cited by examiner

*Primary Examiner*—Bradley K. Smith
(74) *Attorney, Agent, or Firm*—Fish & Richardson P.C.

(57) ABSTRACT

A light emitting device is provided in which reduction of recombinations in a light emitting element is prevented by using a low-resistant electrode structure. A light emitting device of the present invention has a light emitting element composed of first and second electrodes and an organic compound layer that is sandwiched between the first and second electrodes, and the device is characterized in that one of the first and second electrodes has a transparent conductive film, a transparent conductive resin formed on the transparent conductive film, and a plurality of conductors formed on the transparent conductive resin.

23 Claims, 13 Drawing Sheets

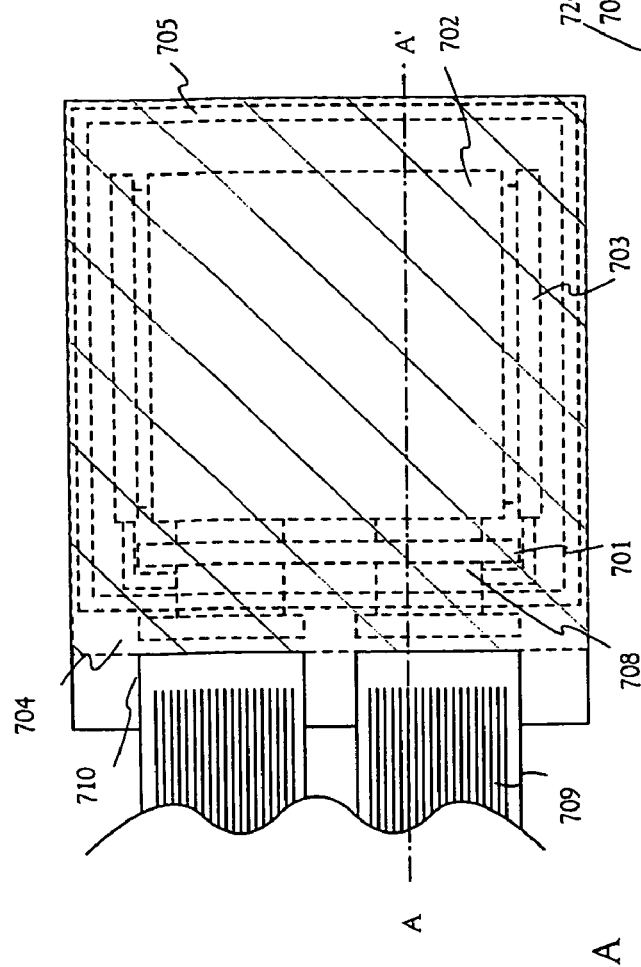
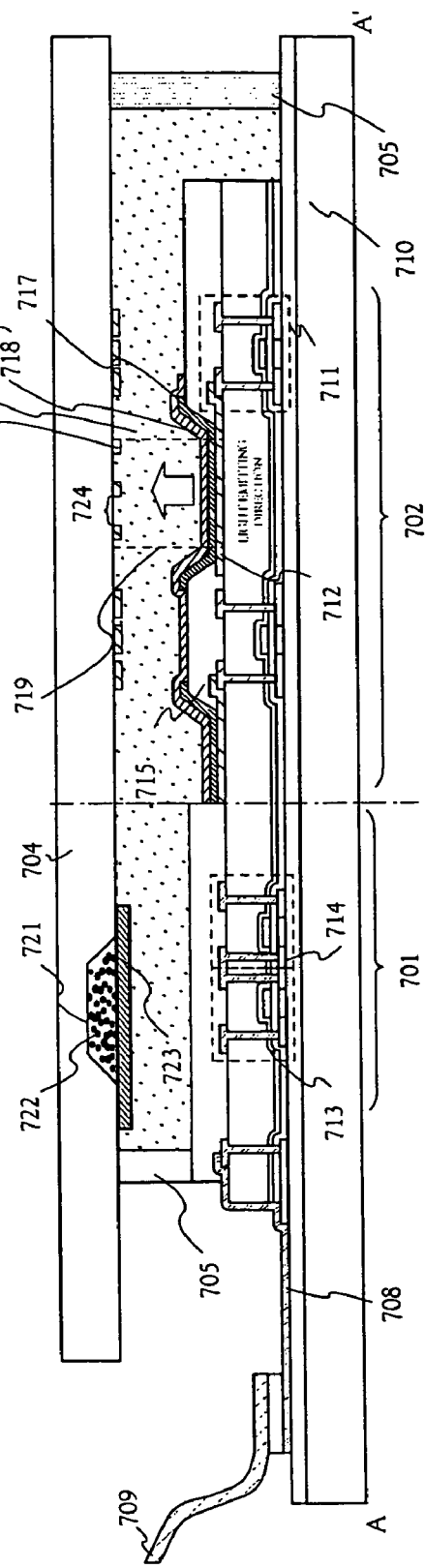
FIG. 8A
FIG. 8B

LIGHT EMITTING DEVICE AND METHOD OF MANUFACTURING THE SAME

CROSS-REFERENCE TO RELATED APPLICATIONS

This application is a divisional application of U.S. application Ser. No. 10/191,517, filed Jul. 10, 2002, now U.S. Pat. No. 6,844,672, which claims the benefit of foreign priority applications filed in Japan as Serial No. 2001-211454 on Jul. 11, 2001 and Serial No. 2002-122446 on Apr. 24, 2002. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a light emitting device with a light emitting element that has a film containing an organic compound that emits fluorescent light or phosphorescent light upon application of electric field (the film is hereinafter referred to as organic compound layer), and to a method of manufacturing the light emitting device.

In the present invention, a light emitting element is an element that has an organic compound layer between a pair of electrodes and the term light emitting device includes an image display device which uses this organic light emitting element. Also, the following modules are all included in the definition of the light emitting device: a module obtained by attaching to a light emitting element a connector such as an anisotropic conductive film (FPC: flexible printed circuit), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) method.

2. Description of the Related Art

Light emitting devices, which are characterized by their thinness and light-weight, fast response, and direct current low voltage driving, are expected to develop into next-generation flat panel displays. Among light emitting devices, ones having light emitting elements arranged to form a matrix are considered to be particularly superior to conventional liquid crystal display devices for their wide viewing angle and excellent visibility.

It is said that light emitting elements emit light through the following mechanism: a voltage is applied between a pair of electrodes that sandwich an organic compound layer, electrons injected from the cathode and holes injected from the anode are re-combined at the luminescent center of the organic compound layer to form molecular excitons, and the molecular excitons return to the base state while releasing energy to cause the light emitting element to emit light. Excitation state includes a singlet exiton and a triplet exiton, and it is considered that luminescence can be made through either excitation state.

Light emitting devices having light emitting elements arranged to form a matrix can employ passive matrix driving (simple matrix light emitting devices), active matrix driving (active matrix light emitting devices), or other driving methods. If the pixel density is large, active matrix light emitting devices in which each pixel has a switch are considered to be advantageous because they can be driven with low voltage.

In an active matrix light emitting device, a thin film transistor (hereinafter referred to as TFT) is formed on an insulating surface, an interlayer insulating film is formed over the TFT, and an anode of the light emitting element is formed to be electrically connected to the TFT through the interlayer insulating film. The material suitable for the anode is a transparent conductive material having a large work function, typically, ITO (indium tin oxide).

An organic compound layer is formed on the anode. The organic compound layer includes a hole injection layer, a hole transporting layer, a light emitting layer, a blocking layer, an electron transporting layer, an electron injection layer, etc. The organic compound layer may be a single layer that emits light, or may have a combination of the above-mentioned layers.

After forming the organic compound layer, a cathode is formed to complete the light emitting element. The laminate of the anode, cathode, and organic compound layer corresponds to the light emitting element. The material used to form the cathode is a metal having a small work function (typically a metal belonging to Group 1 or 2 in the periodic table) or an alloy containing the metal.

A first insulating layer is formed from an organic resin material to cover an end of the anode. The first insulating layer is provided to prevent short circuit between the anode and the cathode that is formed after the anode is formed.

The transparent conductive film used as the anode transmits visible light and therefore allows light emitted from the organic compound layer to pass therethrough. However, the transparent conductive film has a drawback of high resistivity compared to the resistivity of a metal. High film resistance of the anode formed of the transparent conductive film brings difficulty to injection of carriers and lowers the number of carriers that are re-combined in the light emitting element. Less recombinations in the light emitting element correspond to the light emission mechanism of the light emitting element ceasing to function. As a result, the light emitting element cannot emit light at a desired luminance.

SUMMARY OF THE INVENTION

The present invention has been made in view of the above, and an object of the present invention is therefore to provide a light emitting device in which reduction of recombinations in a light emitting element is prevented by employing a low-resistant electrode structure.

According to the present invention, a light emitting device has a light emitting element composed of first and second electrodes and an organic compound layer that is sandwiched between the first and second electrodes, and the device is characterized in that one of the first and second electrodes has a transparent conductive film, a transparent conductive resin formed on the transparent conductive film, and a plurality of conductors formed on the transparent conductive resin. The present invention obtains the effect of lowering the resistance of the transparent conductive film by forming the plural conductors in the first or second electrode. In this specification, an electrode above the organic compound layer is called a first electrode (upper electrode) and an electrode below the organic compound layer is called a second electrode (lower electrode). The term transparent conductive resin refers to a conductive resin that has 75% or higher light transmittance, preferably, 90% or higher.

According to the present invention, a light emitting device has a plurality of light emitting elements each composed of first and second electrodes and an organic compound layer that is sandwiched between the first and second electrodes, and the device is characterized in that one of the first and second electrodes has a transparent conductive film, a transparent conductive resin formed on the transparent conductive film, and a plurality of conductors formed on the transparent conductive resin, and that a partition wall is formed between adjacent light emitting elements.

According to the present invention, the light emitting device is characterized in that an opening is formed between adjacent conductors, and that light emitted from the organic compound layer reaches outside through the opening.

When a light emitting device has an opening, a voltage cannot uniformly be applied to its organic compound layer to make it impossible to obtain sufficient light emission. However, this is not a problem in the light emitting device of the present invention, because the transparent conductive resin is formed to be brought into contact with the transparent conductive film and with the cover member having the plural conductors and opening. In other words, in the present invention, the electric field is uniformly applied to the organic compound layer because the present invention can make the transparent conductive resin function as a part of the electrodes. The transparent conductive resin also has a function of bonding the transparent conductive film to the plural conductors and the cover member. In this specification, the term cover member refers to a substrate that faces an element substrate and is bonded to the element substrate with a seal pattern sandwiched between the substrates.

The light emitting device of the present invention is characterized in that a seal pattern is formed outside the light emitting element and that an opening is formed in the seal pattern. With the opening formed in the seal pattern, the transparent conductive resin can be injected through the opening.

According to the present invention, a light emitting device has a light emitting element electrically connected to a TFT, and is characterized in that an insulating film, a transparent conductive film, a transparent conductive resin, and a plurality of conductors are formed above a gate electrode of the TFT, or above a gate wiring line connected to the TFT, or above a source wiring line connected to the TFT, or above a drain wiring line connected to the TFT, or above a current supplying line connected to the TFT, the transparent conductive film being formed on the insulating film, the transparent conductive resin being formed on the transparent conductive film, the plural conductors being formed on the transparent conductive resin. Having the above-mentioned characteristic, the present invention can reduce the resistance of the transparent conductive film without lowering the aperture ratio.

The light emitting device of the present invention is characterized in that each of the conductors is 0.5 to 5 μm in width. The light emitting device of the present invention is characterized in that the opening is 10 to 100 μm in width.

A high molecular weight material can be used for the transparent conductive resin. A low molecular weight material refers to a material that is lower in molecular weight than a high molecular weight material.

Light obtained from the light emitting element may be one or both of light emission by singlet excitation and light emission by triplet excitation.

BRIEF DESCRIPTION OF THE DRAWINGS

In the accompanying drawings:

FIGS. 8A and 8B are diagrams of a light emitting device with FIG. 8A showing the top structure thereof and FIG. 8B showing the sectional structure thereof of Embodiment 4;

DETAILED DESCRIPTION OF THE PREFERRED EMBODIMENTS

Embodiment Mode

An embodiment mode of the present invention will be described with reference to FIGS. 1A to 4.

Figure 1A:
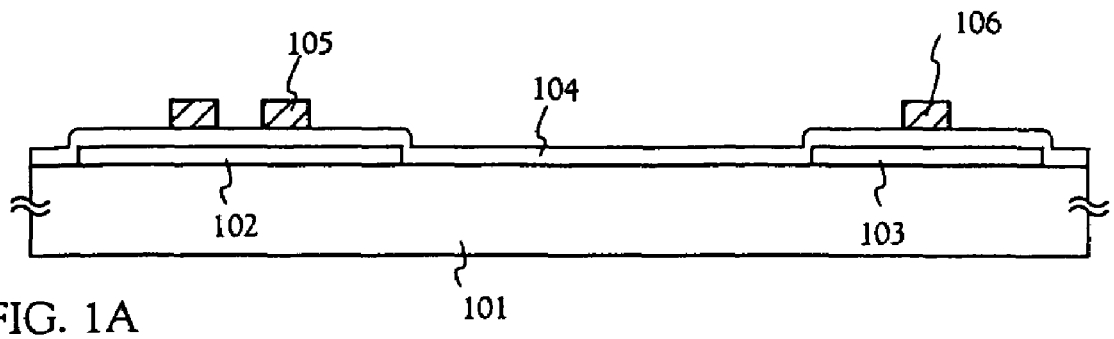
FIGS. 1A to 1D are diagrams showing a process of manufacturing a light emitting device of the present invention.

In FIG. 1A, thin film transistors are formed on a substrate 101. The substrate 101 in this embodiment mode is a glass substrate, but a quartz substrate, a silicon substrate, a metal substrate, or a ceramic substrate may be used instead.

Next, a crystalline silicon film is formed into a thickness of 50 nm. The crystalline silicon film can be formed by a known method.

Figure 3A:
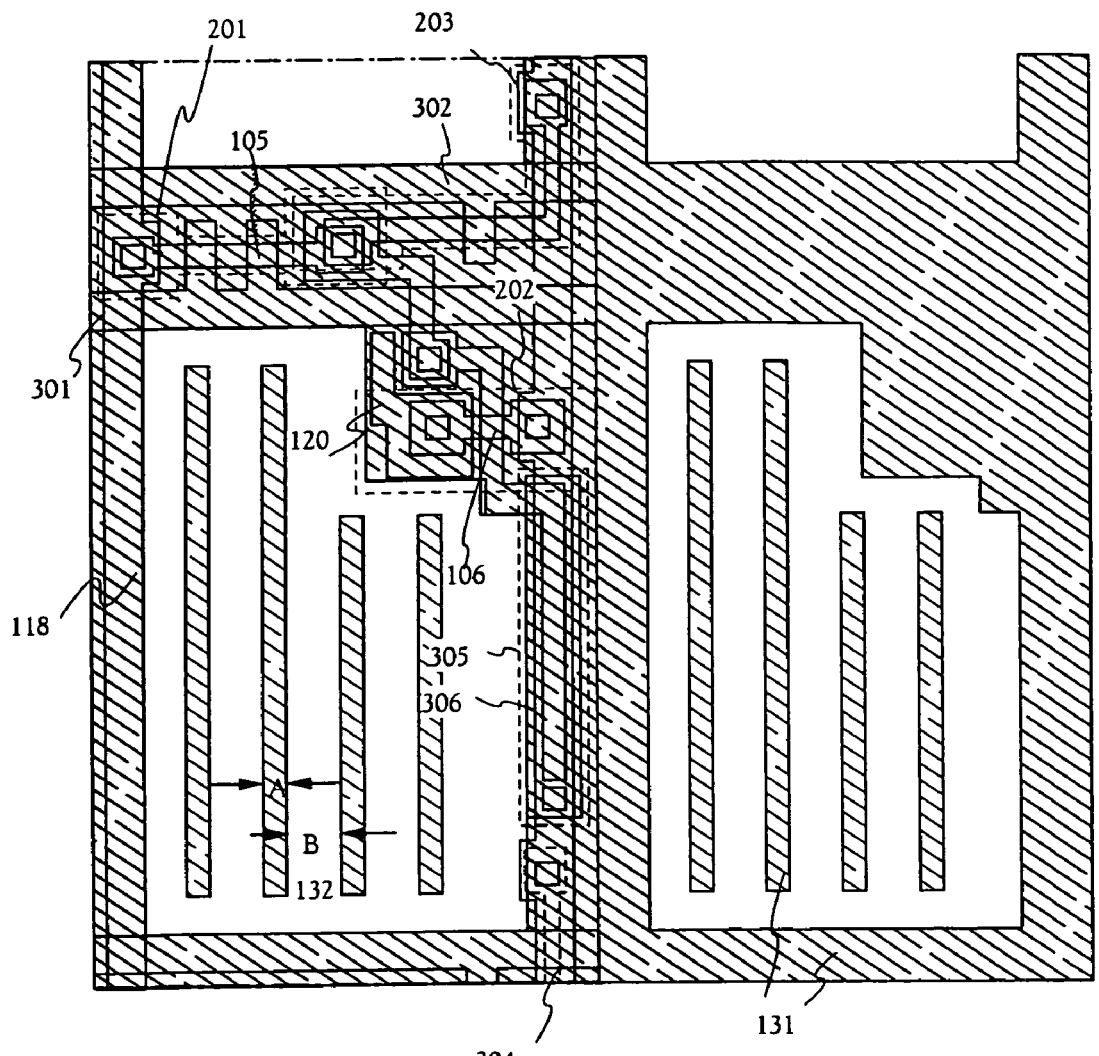
FIGS. 3A and 3B are diagrams showing the top structure of a light emitting device and the circuit structure thereof of the present invention.

The crystalline silicon film is patterned to form an island-like crystalline silicon film 102 and an island-like crystalline silicon film 103 (102 and 103 are hereinafter referred to as active layers). A silicon oxide film is formed as a gate insulating film 104 to cover the active layers 102 and 103. A gate electrode 105 and a gate electrode 106 are formed on the gate insulating film 104. The material of the gate electrodes 105 and 106 is a tungsten film, or a tungsten alloy film, with a thickness of 350 nm. The gate electrodes 105 and 106 are a part of a gate wiring line 301 as shown in FIG. 3A.

Figure 1B:
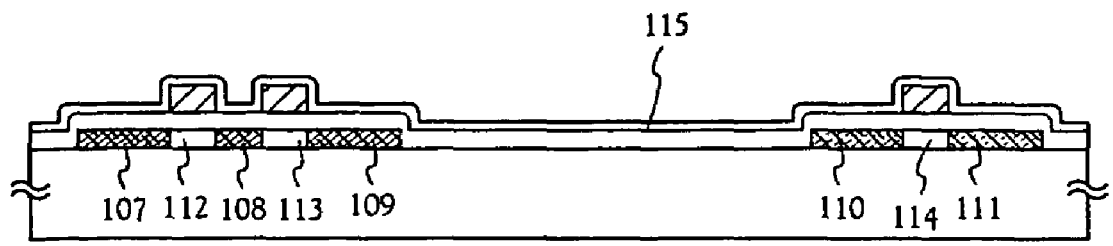

Using the gate electrodes 105 and 106 as masks, the active layers 102 and 103 are doped with an element that belongs to Group 13 in the periodic table (typically boron) as shown in FIG. 1B. A known method can be employed to dope the active layers with the element. Thus formed are impurity regions 107 to 111 having the p type conductivity (hereinafter referred to as p type impurity regions). Channel formation regions 112 to 114 are defined below the gate electrodes 105 and 106. The p type impurity regions 107 to 111 individually serve as source regions or drain regions of the TFTs.

Next, a protective film (here, a silicon nitride film) 115 is formed into a thickness of 50 nm. Then the element belonging to Group 13 in the periodic table, which has been used to dope the active layers, is activated by heat treatment. The activation can be achieved by furnace annealing, laser annealing, or lamp annealing, or by a combination of these annealing methods. In this embodiment mode, heat treatment is conducted at 500° C. for four hours in a nitrogen atmosphere.

It is effective to conduct hydrogenation treatment after the activation is finished. A known hydrogen annealing technique or plasma hydrogenation technique can be employed for the hydrogenation treatment.

Figure 1C:
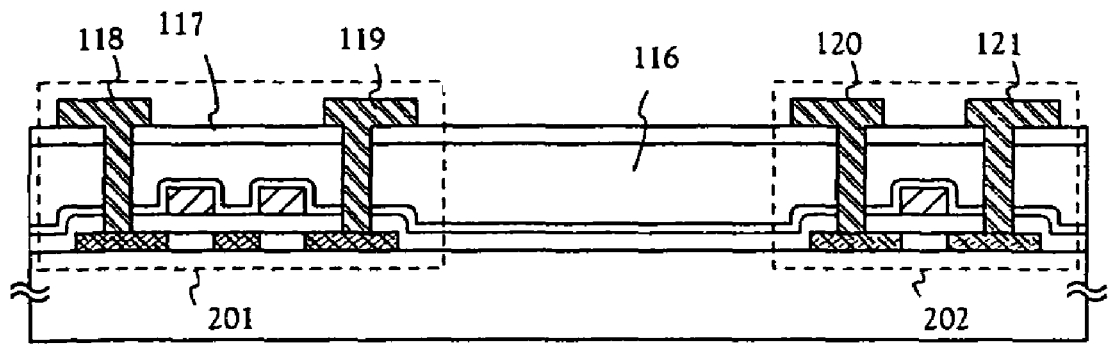

Next, as shown in FIG. 1C, a first interlayer insulating film 116 is formed from an organic resin such as polyimide, acrylic, or polyimideamide to have a thickness of 800 nm. The organic resin is applied by a spinner and then heated to be burnt or polymerized, thereby obtaining a flat surface. Organic resin materials in general are low in dielectric constant and therefore can reduce parasitic capacitance. The first interlayer insulating film 116 may instead be an inorganic insulating film.

Next, a second interlayer insulating film 117 is formed on the first interlayer insulating film 116 so that gas leakage from the first interlayer insulating film 116 does not affect the light emitting element. The second interlayer insulating film 117 is an inorganic insulating film, typically, a silicon oxide film, a silicon oxynitride film, or a silicon nitride film, or a laminate having the above-mentioned insulating films in combination. The second interlayer insulating film is formed by plasma CVD in which the reaction pressure is set to 20 to 200 Pa, the substrate temperature to 300 to 400° C., and the power density to 0.1 to 1.0 W/cm$^2$ at high frequency (13.56 MHz) for electric discharge. Alternatively, the surfaces of the first and second interlayer insulating films 116 and 117 are subjected to plasma treatment to form a cured film that contains one or more kinds of gas elements selected from the group consisting of hydrogen, nitrogen, carbon halide, hydrogen fluoride, and noble gas.

Thereafter, a resist mask having a desired pattern is formed and contact holes reaching drain regions of the TFTs are formed to form wiring lines 118 to 121. The wiring lines are obtained by patterning into a desired pattern a conductive metal film that is formed from Al or Ti or from an alloy of Al or Ti by sputtering or vacuum evaporation. The wiring lines 118 and 119 respectively function as a source wiring line and a gate wiring line.

Figure 3B:
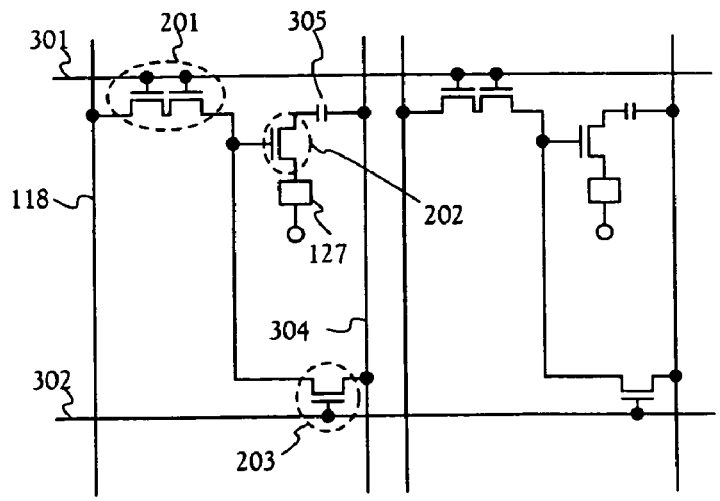

The TFTs are completed through the above-mentioned steps. In the light emitting device of this embodiment mode, a switching TFT 201 and a current controlling TFT 202 are formed as shown in FIG. 1C. Though not shown in FIG. 1C, an erasing TFT 203 of FIGS. 3A and 3B is also formed at the same time. A gate electrode of the erasing TFT 203 is a part of a gate wiring line 302. The gate wiring line 302 and a gate wiring line 301 that forms a gate electrode of the switching TFT 201 are separate wiring lines. The TFTs in this embodiment mode are all p-channel TFTs but the present invention is not limited thereto. N-channel TFTs can be also used. The conductivity type of the TFTs can be set at designer's discretion.

A capacitor storage 305 shown in FIGS. 3A and 3B is also formed at the same time as the TFTs are formed. The storage capacitor 305 is composed of a storage capacitor and another storage capacitor. The former storage capacitor is positioned below a wiring line that forms the gate electrode 106 and includes a semiconductor layer 306, the gate insulating film 104, and the wiring. The semiconductor layer 306 is formed at the same time the active layers of the TFTs are formed. The latter storage capacitor includes the wiring line that forms the gate electrode 106, the protective film 115, the first interlayer insulating film 116, the second interlayer insulating film 117, and a current supplying line 304. The semiconductor layer 306 is electrically connected to the current supplying line 304.

Figure 1D:
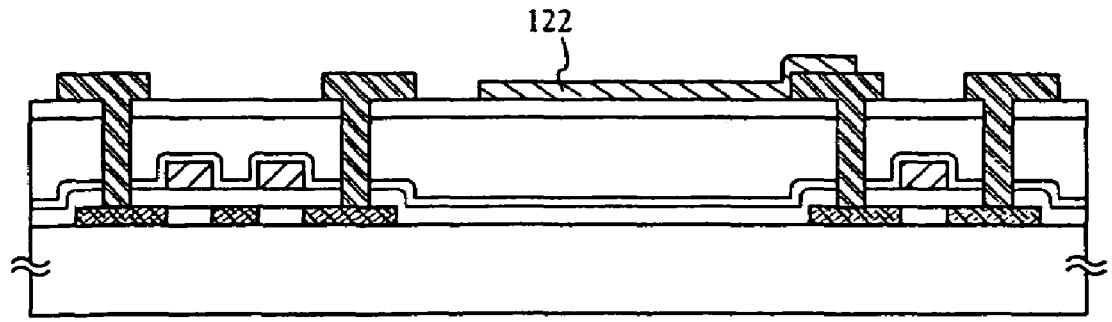

Next, a conductive film is formed and then the conductive film is etched as shown in FIG. 1D to complete the lower electrode 122. The lower electrode 122 acts as a cathode or an anode depending on whether its work function is larger or smaller than the work function of an upper electrode 124. The conductive film is desirably 0.1 to 1 µm in thickness.

Thereafter, an organic resin film is formed on the entire surface from polyimide, acrylic, or polyimideamide. A thermally-curable material that is cured by heating or a photosensitive material that is cured by irradiation of ultraviolet ray is employed for the organic resin film. When a thermally-curable material is used, a resist mask is formed after the organic resin film is formed on the entire surface, and an insulating layer 123 having an opening above the lower electrode 122 is formed by dry etching. When a photosensitive material is employed, a photo mask is formed after the organic resin film is formed on the entire surface and an insulating layer 123 is formed above the lower electrode 122 through exposure and development using the photo mask. In either case, the insulating layer 123 is formed to have a tapered edge and cover an end portion of the lower electrode 122. Having the edge tapered, the insulating layer can be covered well with an organic compound layer that is to be formed subsequently.

An organic compound layer 130 is formed next. The organic compound layer 130 is a laminate having a hole generating layer, a light emitting layer, a hole injection layer, a hole transporting layer, a hole blocking layer, an electron transporting layer, an electron injection layer, a buffer layer, etc. suitably selected in combination. These layers may be formed of low molecular weight materials or high molecular weight materials.

Then a transparent conductive film 126 is formed. A transparent conductive high molecular weight material such as ITO is used for the transparent conductive film 126. Preferably, the thickness of the transparent conductive film 126 is 80 to 200 nm. If an ITO film is employed, the film is formed by sputtering. If other transparent conductive high molecular weight materials are chosen, the film is formed by spin coating.

If the organic compound layer 130 is formed on the lower electrode 122 so as to obtain a flat surface, defects such as dark spot and light emission failure of the light emitting element due to short circuit between the lower electrode 122 and the transparent conductive film 126 can be prevented. (FIG. 2A)

Figure 2A:
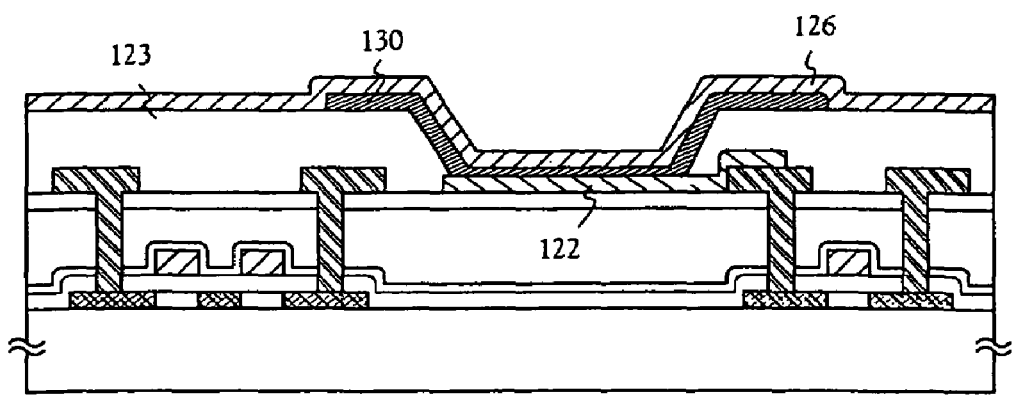
FIGS. 2A to 2C are diagrams showing a process of manufacturing a light emitting device of the present invention.
Figure 2B:
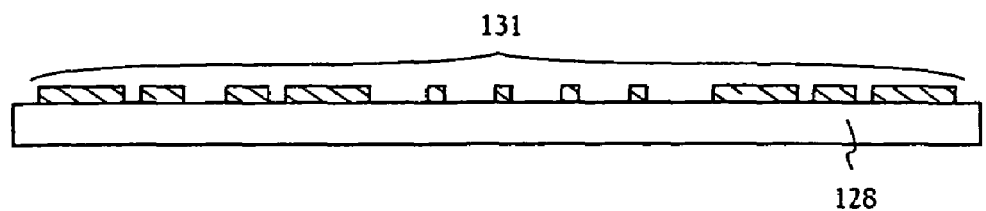
Figure 2C:
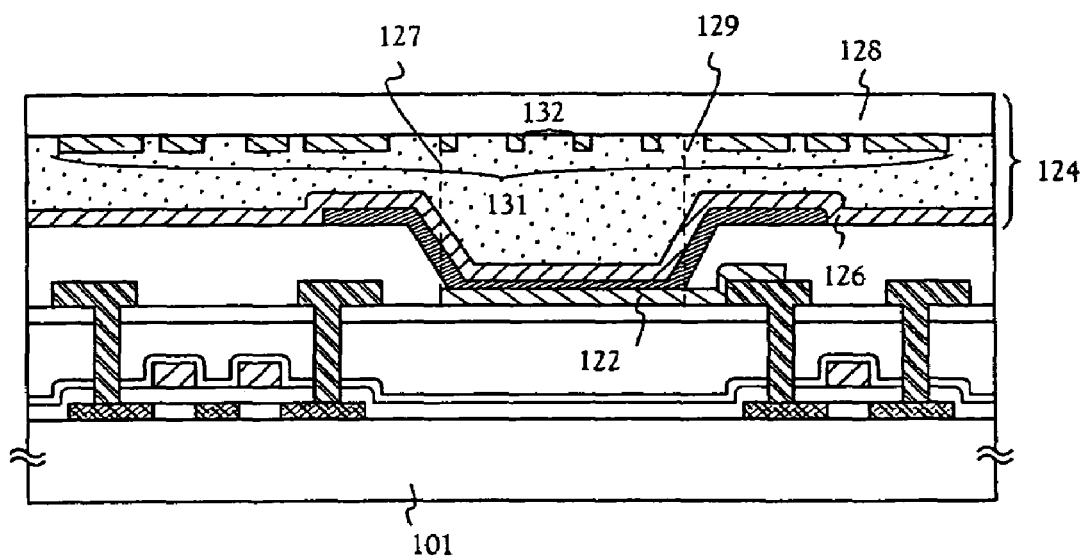

As shown in FIG. 2B, a metal is deposited by evaporation on a cover member 128 and the obtained metal film is patterned to form conductors 131 on the cover member 128. The metal that can be used in this embodiment mode is silver, gold, platinum, palladium, aluminum, magnesium, calcium, indium, copper, neodium, nickel, tin, chromium, or the like. The cover member 128 is bonded to the substrate in a later step as shown in FIG. 3A. Then, a width A of each conductor in a pixel is 0.5 to 5.0 µm (preferably 1.0 to 2.0 µm), and a width B (of an opening 132) that is the distance between two adjacent conductors is 10 to 100 µm (preferably 20 to 30 µm). The width B of the opening is appropriately 5 to 15 times the width A. For example, a preferable opening width is 10 to 30 μm when each conductor is 2.0 μm in width.

The cover member 128 may be a glass substrate or a quarts substrate, or a plastic substrate formed of FRP (fiberglass-reinforced plastic), PVF (polyvinyl fluoride), Mylar, polyester, acrylic, or the like. The cover member may be stepped so that a drying agent can be sealed therein.

Subsequently, the device shown in FIG. 2A is bonded to the device shown in FIG. 2B. Specifically, a seal pattern (not shown in the drawing) is formed along the end faces (perimeter) of the cover member 128. Then a transparent conductive resin 129 is applied to the surface of the cover member 128 inside the seal pattern. This embodiment mode employs as the transparent conductive resin 129 polypyrrole, polyaniline, polythiophene, poly(3,4-ethylene dioxythiophene), polyisothianaphthene, polyacetylene, tetracyanoquinodimethane, a polyvinyl chloride composition, or a high molecular weight material mainly containing an aromatic amine polymer. The resin 129 may also be a compound of these materials. The above-mentioned materials may be suitably doped with dopants.

Keeping the interior of a vacuum exhaust apparatus at a vacuum state and applying a constant pressure to the substrate 101 and the cover member 128, the substrate 101 is bonded to the cover member 128. The substrate 101 and the cover member 128 are bonded such that the side of the substrate 101 on which the organic compound layer 130 is formed opposes the side of the cover member 128 on which the conductors 131 are formed. At this point, the seal member formed on the cover member 128 is heated and cured.

Thus completed is a light emitting device having a light emitting element 127 that is composed of the upper electrode 124, the lower electrode 122, and the organic compound layer 130. The upper electrode 124 is composed of the transparent conductive film 126, the transparent conductive resin 129, and the conductors 131. The conductors 131 and the opening 132 are formed above the light emitting element 127 that is electrically connected to the TFTs. The transparent conductive film, the transparent conductive resin on the transparent conductive film, and the conductors on the transparent conductive resin are also formed above the gate electrodes on the TFTs, above the source wiring lines connected to the TFTs, above the gate wiring lines connected to the TFTs, above the drain wiring lines connected to the TFTs, and above the current supplying line connected to the TFTs.

As described above, a light emitting device having a low-resistant conductive film can be obtained by forming the transparent conductive film 126, the conductors 131, and the transparent conductive resin 129 sandwiched between the transparent conductive film 126 and the conductors 131 as described above.

Since the opening 132 is formed between adjacent conductors in the pixel, light emitted from the organic compound layer 130 can reach outside through the opening 132. As a result, the light emitting element can emit light upward. The transparent conductive film of the light emitting element 127 in the present invention is not limited to a transparent material, and therefore a choice of materials that can be used for the electrode is widened.

In the light emitting device of the present invention, the organic compound layer 130 can be shut off from the outside. To elaborate, external substances that accelerate degradation of the organic compound layer 130, such as moisture and oxygen, can be prevented from entering the light emitting element. Accordingly, the present invention eliminates the need for a space filled with inert gas, thereby making it possible to reduce the thickness of the light emitting device greatly.

FIG. 3A is a top view of the conductors 131.

The conductors 131 are placed above the gate electrodes 105 and 106, the source wiring line 118, the drain wiring line 120, the gate wiring lines 301 and 302, and the current supplying line 304 and in the pixel.

Preferably, the conductors 131 are placed in at least one of the following positions: above the gate electrodes 105 and 106, above the wiring line 118, above the drain wiring line 120, above the gate wiring lines 301 and 302, above the current supplying line 304, and in the pixel, while interposing an insulating film therebetween. This arrangement is effective in lowering the resistance of the transparent conductive film 126.

Instead of forming the conductors in the pixel portion, plural conductors may be formed above a gate electrode having high light-shielding ability, above a source wiring line, above a gate wiring line, above a drain wiring line, or above a current supplying line while interposing an insulating film therebetween. This makes it possible to lower the resistance of the transparent conductive film without reducing the aperture ratio.

In the present invention, the conductors desirably occupy as small an area as possible in the pixel. The conductors above the TFTs and the wiring lines desirably occupy as large an area as possible.

Figure 4:
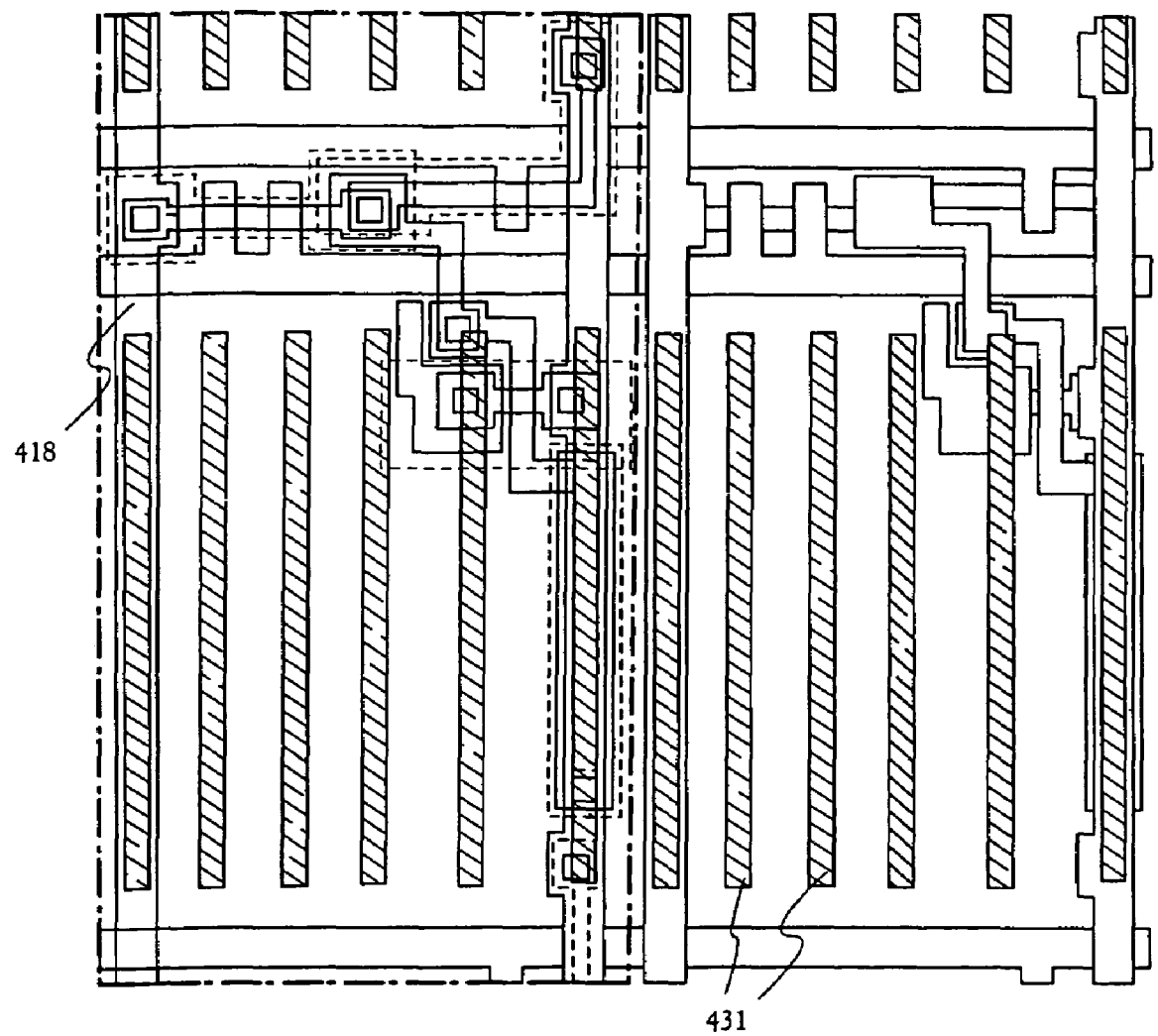
FIG. 4 is a diagram showing the top structure of a light emitting device and the circuit structure thereof of the present invention.

As shown in FIG. 4, conductors 431 may be in parallel with a source wiring line 418.

Figure 5A:
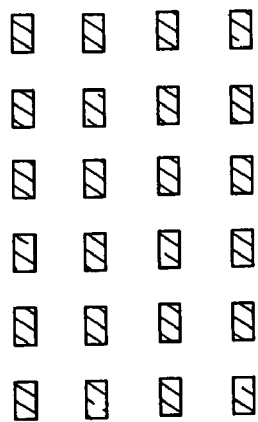
FIGS. 5A to 5F are diagrams showing shapes of electrodes of conductors of the present invention.
Figure 5D:
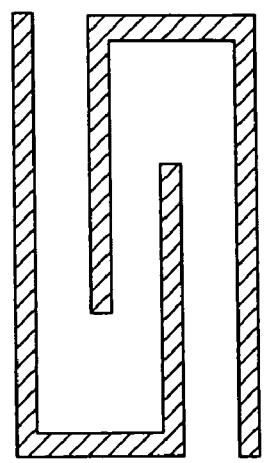
Figure 5B:
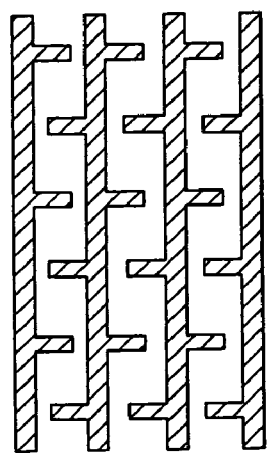
Figure 5E:
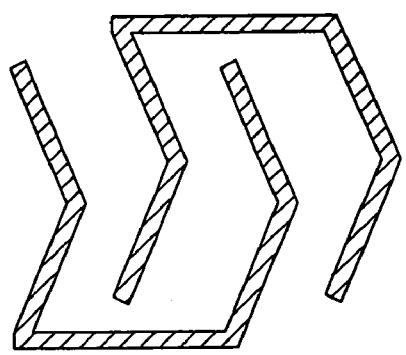
Figure 5C:
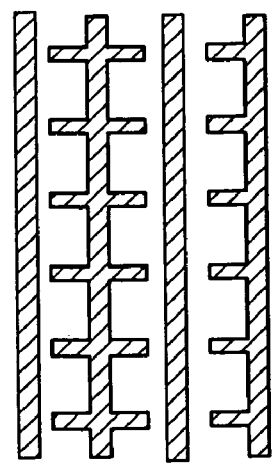
Figure 5F:
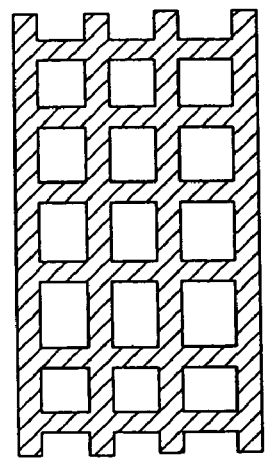

FIGS. 3A and 3B and FIG. 4 show conductors forming a stripe pattern in the pixel. However, the pattern of the conductors are not particularly limited. For instance, the conductors may be rectangles as shown in FIG. 5A, or may be brandied as shown in FIGS. 5B and 5C, or may be electrically connected to other electrodes as shown in FIGS. 5D and 5E, or may form a grid pattern as shown in FIG. 5F.

In this embodiment mode, the seal pattern is formed on the cover member and the transparent conductive resin is applied to the cover member to complete the light emitting device. However, the present invention is not limited thereto. The seal pattern may be formed on the substrate and the transparent conductive resin may be applied to the substrate to obtain the light emitting device.

In this embodiment mode, the transparent conductive resin 129 is applied to the surface of the cover member inside the seal pattern in a manner similar to the liquid crystal drop injection method employed in a liquid crystal display device manufacturing process. The applied transparent conductive resin 129 is sandwiched between the substrate and the cover member 128 in the light emitting device manufactured in accordance with the present invention. Alternatively, the seal pattern may have an opening so that the transparent conductive resin is injected through the opening similar to the manner in which a liquid crystal is injected through an injection port in vacuum. If the transparent conductive resin has high viscosity, the resin may be heated or pressurized. After the injection, the opening may be closed by an end-sealing material.

The present invention is not limited to the TFT structures employed in this embodiment mode but may take the inverted stagger structure or the top gate structure.

Embodiment 1

This embodiment describes the structure of a light emitting element of a light emitting device according to the present invention. The description is given with reference to FIG. 6.

Figure 6:
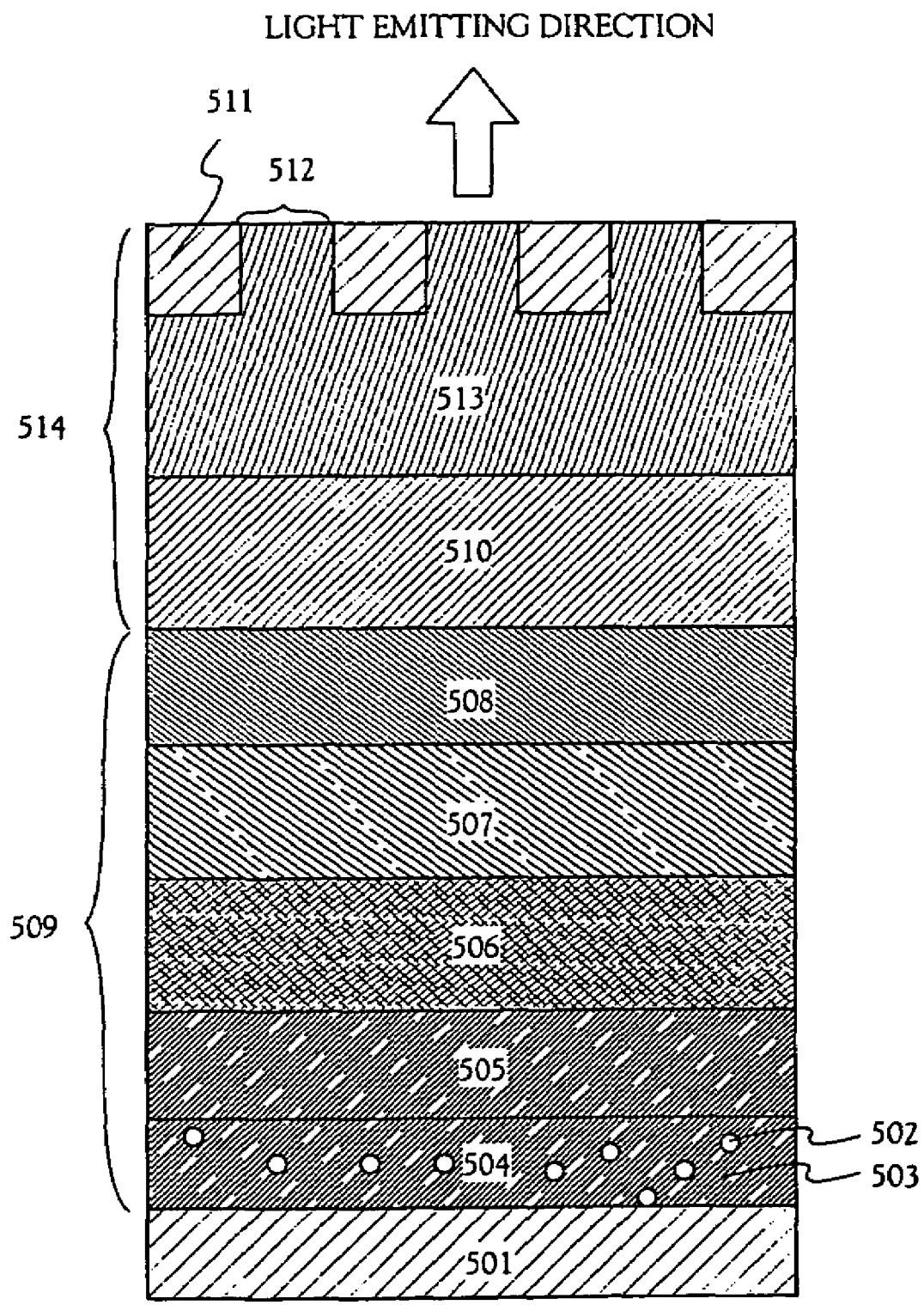
FIG. 6 is a diagram showing the element structure of a light emitting element of the present invention.

In FIG. 6, reference symbol 501 denotes a lower electrode, which is a film of a metal such as platinum (Pt), chromium (Cr), tungsten (W), or nickel (Ni). The lower electrode 501 corresponds to an anode. The role of the lower electrode 501 in this embodiment is to inject holes to an organic compound layer when a voltage is applied. Therefore, the material of the lower electrode 501 is required to be higher in HOMO level than the organic compound that forms the organic compound layer. In other words, the lower electrode is desirably formed from a material having a large work function.

Next, a hole generating layer 504 is formed by co-evaporation of an electron acceptor 502 and a low molecular weight material 503. In this embodiment, the material of the electron acceptor 502 can be the same material given in Embodiment Mode. The low molecular weight material 503 used in this embodiment is a material capable of injecting holes.

The hole generating layer 504 in this embodiment is formed into a thickness of 100 to 200 nm by co-evaporation of the low molecular weight material 503 that is a material capable of injecting holes and the electron acceptor 502.

The hole generating layer 504 in the present invention is a film transmissive of light. Examples of the low molecular weight material 503 include condensed rings hydrocarbon such as anthracene, tetracene, or pyrene, normal paraffin, oligothiophene-based materials, and phthalocyanine-based materials. Examples of the electron acceptor 502 include TCNQ (tetracyano-quinodimethan), $FeCl_3$, $ZrCl_4$, $HfCl_4$, $NbCl_5$, $TaCl_5$, $MoCl_5$, and $WCl_6$.

Also, in the case where the hole-generating layer is formed using a polymeric material, the hole-generating layer can be formed by existing the polymeric material such as polyacetylenes, polythiophenes, poly(3-methyl)thiophenes, poly(3-ethyl) thiophenes, poly(3-n-butyl) thiophenes, poly (3-hexyl) thiophenes, poly (3-octyl) thiophenes, poly (3-dodecyl) thiophenes, poly (3-octadecyl)thiophenes, poly (3-eicosyl)thiophenes and poly(3-methyl-Co-butyl) thiophenes together with the electron acceptor 502 (acceptor) such as PF6-, bromine and iodine in a solvent and using the printing method, the ink jet method or the spin coating method.

When forming the hole generating layer 504, the molar ratio of the low molecular weight material 503 to the electron acceptor 502 is desirably 1:1. Electric charges move between an organic material and the electron acceptor 502 when an electron of the organic material is pulled out of the organic material by the electron acceptor 502, thereby generating holes from the organic material. Accordingly, holes are injected from the lower electrode upon application of a voltage and the density of holes flowing is raised. The presence of the hole generating layer 504 makes it possible to form the organic compound layer uniformly and to apply electric field uniformly to the organic compound layer, as well. Therefore a highly reliable light emitting element can be formed.

Next, a hole injection layer 505, a hole transporting layer 506, a light emitting layer 507, and an electron transporting layer 508 are layered.

The hole injection layer 505 is formed from a material capable of injecting holes. This embodiment employs the same low molecular weight material that the hole generating layer 504 uses to form the hole injection layer 505 to have a thickness of 10 to 30 nm. By forming the hole generating layer 504 and the hole injection layer 505 from the same low molecular weight material, the energy barrier between the two layers is lowered to make it easy for carriers to move.

The hole transporting layer 506 is formed from a material capable of transporting holes. This embodiment uses as a material capable of transporting holes an aromatic amine-based material such as 4,4'-bis[N-(1-naphthyl)-N-phenyl-amino] biphenyl (denoted by α-NPD), 1,1-bis[4-bis(4-methylphenyl)-amino-phenyl] cyclohexane (denoted by TPAC), or 4,4',4"-tris[N-(3-methylphenyl)-N-phenyl-amino] triphenyl amine (denoted by MTDATA). The thickness of the hole transporting layer 506 is 30 to 60 nm.

The light emitting layer 507 is formed from a luminous material. This embodiment uses as a luminous material Alq3 or Alpq3 that is obtained by introducing phenyl base to Alq3. The thickness of the light emitting layer 507 is 30 to 60 nm. The light emitting layer 507 may be doped with a dopant. The dopant can be a known material such as perylene, rubrene, coumarin, 4-(dicyanomethylene)-2-methyl-6-(p-dimethyl aminostylil)-4H-pyran (denoted by DCM), or quinacridon.

The light emitting layer 507 may be formed by co-evaporation of CBP and an iridium complex (Ir(ppy)3) or a platinum complex. CBP is a dopant and the iridium complex emits light by triplet excitation. In this case, a hole blocking layer has to be formed between the light emitting layer 507 and the electron transporting layer 508. The hole blocking layer is formed from BCP to have a thickness of 10 to 30 nm.

The electron transporting layer 508 is formed from a material capable of transporting electrons. This embodiment employs as a material capable of transporting electrons a 1,3,4-oxadiazole derivative, a 1,2,4-triazole derivative, or the like. Specifically, the material that can be used for the layer 508 is 2-(4-biphenylyl)-5-(4-tert-butylphenyl)-1,3,4-oxadiazole (denoted by PBD), 2,5-(1,1'-dinaphthyl)-1,3,4-oxadiazole (denoted by BND), 1,3-bis [5-(p-tert-butylphenyl)-1, 3,4-oxadiazole-2-Ile] benzene (denoted by OXD-7), or 3-(4-tert-butylphenyl)-4-phenyl-5-(4-biphenylyl)-1,2,4-triazole (denoted by TAZ). The thickness of the electron transporting layer 508 is 30 to 60 nm.

The hole generating layer 504, the hole injection layer 505, the hole transporting layer 506, the light emitting layer 507, and the electron transporting layer 508 (and the blocking layer) together make an organic compound layer 509. After the organic compound layer 509 is formed, a transparent conductive film 510 is formed. In this embodiment, ITO is used to form the transparent conductive film 510 of the light emitting element.

Conductors 511 are formed on a cover member (not shown in the drawing) and an opening 512 is formed in the cover member. This is achieved in this embodiment by evaporation of silver through sputtering and subsequent patterning. The patterning employs etching and a mixture of hydrogen fluoride and nitric acid as etchant. The conductors 511 formed on the cover member (not shown) are bonded to the transparent conductive film 510 in vacuum with a transparent conductive resin 513 sandwiched therebetween. The transparent conductive resin 513 may be applied to the cover member (not shown) or injected from an opening (not shown in the drawing) of the seal pattern as in the above-mentioned Embodiment Mode. The transparent conductive resin 513 of this embodiment is a high molecular weight material mainly containing a polyvinyl chloride composition or an aromatic amine polymer. A polyvinyl chloride composition is a material composed of a vinyl chloride resin, a plasticizer (for example, phthalate esters or glycol esters), and lithium salt (lithium chloride, (trifluoromethane sulfonyl) imide lithium, or the like). An aromatic amine polymer is a polymer such as aminonaphthalenes and aminoquinoline.

The transparent conductive resin 513 is formed on the transparent conductive film 510. The conductors 511 and the opening 512 are formed on the transparent conductive resin 513. In this specification, the conductors 511, the transparent conductive resin 513, and the transparent conductive film 510 are together called an upper electrode 514. The light is emitted in the direction indicated by the arrow in FIG. 6.

As described above, the upper electrode 514 is made up of the transparent conductive film 510, the transparent conductive resin 513, and the conductors 511 to obtain a light emitting device that has a low-resistant conductive film.

Transparent and conductive materials are employed for the transparent conductive film 510 and the transparent conductive resin 513, and the opening 512 is provided between adjacent conductors. Therefore light emitted from the organic compound layer 509 can reach outside through the opening 512. This allows the organic compound layer to emit light upward. A light-shielding material may be employed for the lower electrode 501.

The present invention employs a sealing method in which the contact between the organic compound layer 509 and oxygen or moisture is avoided by forming the transparent conductive resin 513 between the transparent conductive film 510 and the conductors 511. Accordingly, there is no need to provide a space filled with inert gas, making it possible to reduce the thickness of the light emitting device greatly.

The lower electrode 501 serves as an anode and the upper electrode 514 serves as a cathode in this embodiment, but the present invention is not limited thereto. The lower electrode 501 can be a cathode whereas the upper electrode 514 serves as an anode. In this case, the electron transporting layer, light emitting layer, hole transporting layer, hole injection layer, and hole generating layer of the organic compound layer are layered in this order with the electron transporting layer being the closest to the lower electrode.

Embodiment 2

This embodiment describes a case of forming a mixture layer in the light emitting element of Embodiment 1. The description will be given with reference to FIG. 7.

Figure 7:
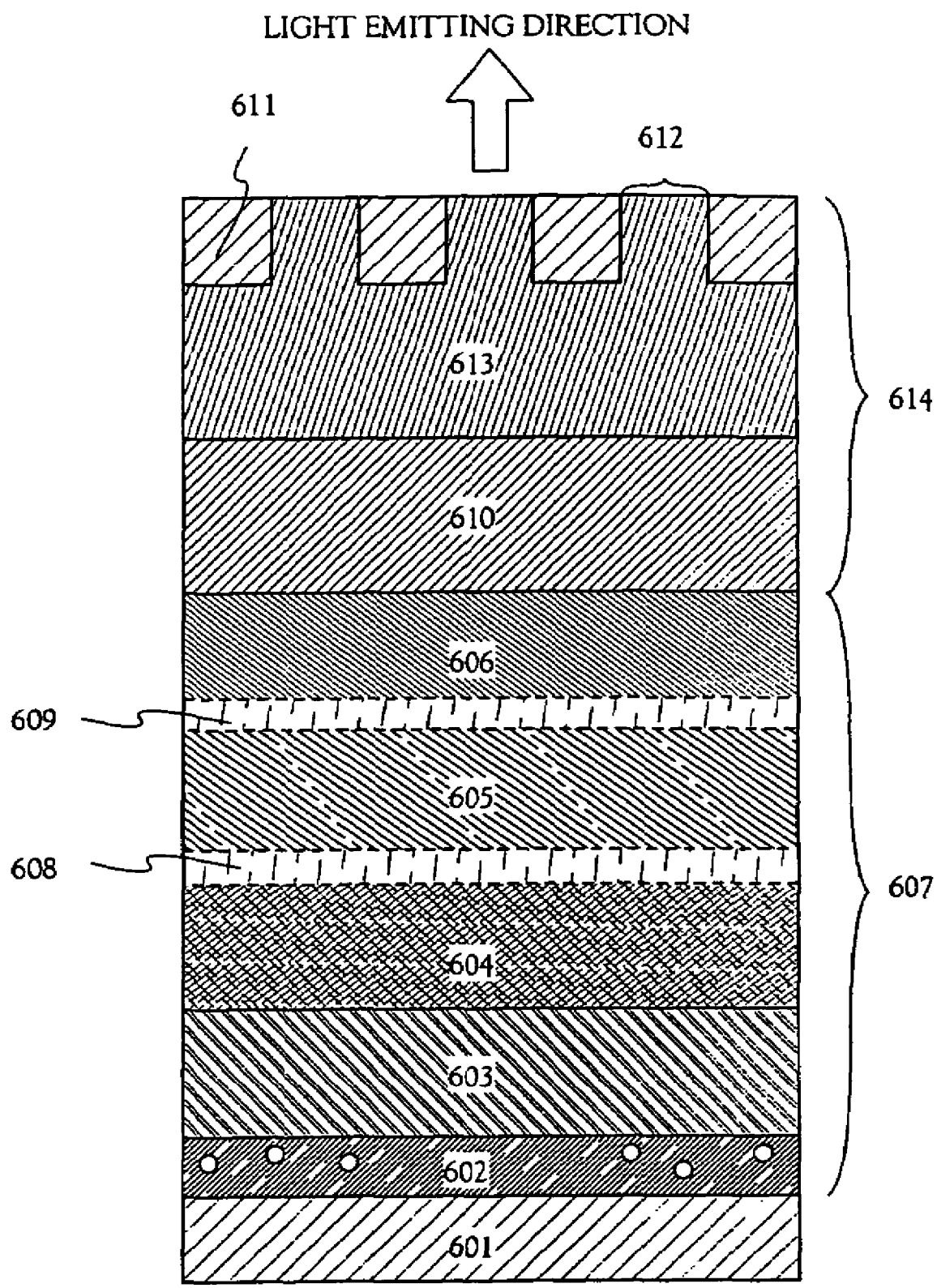
FIG. 7 is a diagram showing the element structure of a light emitting element of Embodiment 2.

In FIG. 7, reference symbol 601 denotes a lower electrode and 602 denotes a hole generating layer that is formed by co-evaporation of an electron acceptor and a low molecular weight material.

A hole injection layer 603, a hole transporting layer 604, a light emitting layer 605, and an electron transporting layer 606 are laminated on the hole generating layer 602 to form an organic compound layer 607. Details about the methods of forming these layers may refer to Embodiment 1.

In this embodiment, the interface between the hole transporting layer 604 and the light emitting layer 605 and the interface between the electron transporting layer 606 and the light emitting layer 605 each have a mixture layer.

In this embodiment, the mixture layer formed at the interface between the light emitting layer 605 and the hole transporting layer 604 is called a mixture layer (1) 608, whereas the mixture layer formed at the interface between the light emitting layer 605 and the electron transporting layer 606 is called a mixture layer (2) 609.

The mixture layer (1) 608 is formed by co-evaporation of the material for forming the light emitting layer 605 and the material for forming the hole transporting layer 604. The ratio of the materials that are mixed to form the mixture layer (1) 608 can be varied.

The mixture layer (2) 609 is formed by co-evaporation of the material for forming the light emitting layer 605 and the material for forming the electron transporting layer 606. The ratio of the materials that are mixed to form the mixture layer (2) 609 can be varied.

After the electron transporting layer 606 is formed, a transparent conductive film 610 is formed by evaporation. In this embodiment, ITO is used to form the transparent conductive film 610 of the light emitting element.

Conductors 611 are formed on a cover member (not shown in the drawing) and an opening 612 is formed in the cover member. This is achieved in this embodiment by evaporation of silver through sputtering and subsequent patterning. The patterning employs etching and a mixture of hydrogen fluoride and nitric acid as etchant. The conductors 611 formed on the cover member (not shown) are bonded to the transparent conductive film 610 in vacuum with a transparent conductive resin 613 sandwiched therebetween. The transparent conductive resin 613 of this embodiment is a high molecular weight material mainly containing a polyvinyl chloride composition or an aromatic amine polymer. A polyvinyl chloride composition is a material composed of a vinyl chloride resin, a plastic material (for example, phthalate esters or glycol esters), and lithium salt (lithium chloride, (trifluoromethane sulfonyl) imide lithium, or the like). An aromatic amine polymer is a polymer such as aminonaphthalenes and aminoquinoline.

The transparent conductive resin 613 is formed on the transparent conductive film 610. The conductors 611 and the opening 612 are formed on the transparent conductive resin 613. In this specification, the conductors 611, the transparent conductive resin 613, and the transparent conductive film 610 are together called an upper electrode 614.

As has been described, the mixture layers are formed at the interfaces between the light emitting layer 605 and the layers adjacent thereto (specifically, the interface between the light emitting layer 605 and the hole transporting layer 604 and the interface between the light emitting layer 605 and the electron transporting layer 606). This structure improves injection of holes from the hole transporting layer 604 to the light emitting layer 605 and injection of electrons from the electron transporting layer 606 to the light emitting layer 605. Accordingly, recombination of carriers in the light emitting layer 605 is enhanced. The light is emitted in the direction indicated by the arrow in FIG. 7.

As described above, the upper electrode 614 is made up of the transparent conductive film 610, the transparent conductive resin 613, and the conductors 611 to obtain a light emitting device that has a low-resistant conductive film.

Transparent and conductive materials are employed for the conductors 611 and the transparent conductive resin 613, and the opening 612 is provided between adjacent conductors. Therefore, light emitted from the organic compound layer 607 can reach outside through the opening 612. This allows the organic compound layer to emit light upward. A light-shielding material may be employed for the lower electrode 601.

The present invention employs a sealing method in which the contact between the organic compound layer 607 and oxygen or moisture is avoided by forming the transparent conductive resin 613 between the transparent conductive film 610 and the conductors 611. Accordingly, there is no need to provide a space filled with inert gas, making it possible to reduce the thickness of the light emitting device greatly.

The lower electrode 601 serves as an anode and the upper electrode 614 serves as a cathode in this embodiment, but the present invention is not limited thereto. The lower electrode 601 can be a cathode whereas the upper electrode 614 serves as an anode. In this case, the electron transporting layer, mixture layer (2), light emitting layer, mixture layer (1), hole transporting layer, hole injection layer, and hole generating layer of the organic compound layer are laminated in this order with the electron transporting layer being the closest to the lower electrode.

Embodiment 3

This embodiment gives a description on a light emitting device having light emitting elements that respectively emit red light, green light, and blue light. In this embodiment, a lower electrode 122 is formed as shown in FIG. 2A and then organic compound layers that emit light in different colors are formed by using different materials for their light emitting layers. All of the light emitting layers are formed by evaporation, which allows the use of metal mask in forming light emitting layers of pixels of different colors from different materials.

In this embodiment, a light emitting layer that emits light in red color (hereinafter referred to as red light emitting layer) is formed first using a metal mask. A known material can be used as the material of the red light emitting layer of this embodiment. All of the red light emitting layers to be formed in the light emitting device may be formed simultaneously. Alternatively, the red light emitting layers may be formed sequentially while moving the metal mask along.

Next, a light emitting layer that emits light in green color (hereinafter referred to as green light emitting layer) is formed using a metal mask. A known material can be used as the material of the green light emitting layer of this embodiment. All of the green light emitting layers to be formed in the light emitting device may be formed simultaneously. Alternatively, the green light emitting layers may be formed sequentially while moving the metal mask along.

Further, a light emitting layer that emits light in blue color (hereinafter referred to as blue light emitting layer) is formed using a metal mask. A known material can be used as the material of the blue light emitting layer of this embodiment. All of the blue light emitting layers to be formed in the light emitting device may be formed simultaneously. Alternatively, the blue light emitting layers may be formed a few at a time while moving the metal mask along.

The above-mentioned steps provide the light emitting device having light emitting elements that respectively emit red light, green light, and blue light. The colors of light emitted from the light emitting elements are not limited to those shown in this embodiment. Known materials such as one that emits white light and one that emits orange light may be used in combination.

Embodiment 4

This embodiment describes the exterior of a light emitting device of the present invention with reference to FIGS. 8A and 8B.

FIG. 8A is a top view of the light emitting device and FIG. 8B is a sectional view taken along the line A–A' of FIG. 8A. Reference symbol 701 denotes a source signal line driving circuit; 702, a pixel portion; and 703, a gate signal line driving circuit. Denoted by 710 is a substrate; 704, a cover member; 705, a seal pattern, 707; a transparent conductive resin; 720, conductors; 721, a concave portion; 722, a drying agent; and 723, a film. The space surrounded by the cover member 704 (including the film 723) and the seal pattern 705 is filled with the transparent conductive resin 707. The light is emitted in the direction indicated by the arrow in FIG. 8B.

Reference symbol 708 represents a connection wiring line for transmitting signals that are to be inputted to the source signal line driving circuit 701 and the gate signal line driving circuit 703. The connection wiring line 708 receives video signals and clock signals from an FPC (flexible printed circuit) 709 that selves as an external input terminal. The FPC alone is shown in the drawings but a printed wiring board (PWB) may be attached to the FPC. In this specification, a light emitting device refers to a light emitting device itself plus an FPC, or plus an FPC and a PWB.

Next, the sectional structure taken along the line A–A' in FIG. 8A is described with reference to FIG. 8B. The driving circuits and the pixel portion are formed On the substrate 710. In FIG. 8B, one of the driving circuits, namely, the source signal line driving circuit 701, and the pixel portion 702 are shown.

The source signal line driving circuit 701 here is a CMOS circuit having a p-channel TFT 713 and an n-channel TFT 714 in combination. The driving circuit can be any known CMOS circuit, PMOS circuit, or NMOS circuit. This embodiment employs a driver-integrated substrate in which driving circuits are formed on a substrate, but the present invention is not limited thereto. The driving circuits may be external to the substrate.

The pixel portion 702 is composed of a plurality of pixels each of which includes a current controlling TFT 711 and a lower electrode 712. The lower electrode 712 is electrically connected to a drain of the current controlling TFT 711.

An insulator 715 is formed on each end of the lower electrode 712. An organic compound layer 717 is formed on the lower electrode 712. A transparent conductive film 718 is formed on the insulator 715 and the organic compound layer 717.

The transparent conductive film 718 also functions as a common wiring line shared by all the pixels and is electrically connected to the FPC 709 through the connection wiring line 708.

The conductors 720 are formed on the cover member 704. An opening 724 is provided between the conductors 720. The cover member 704 is bonded to the substrate 710 in vacuum with the seal pattern 705 interposed therebetween. The transparent conductive resin 707 is formed between the substrate 710 and the cover member 704. Spacers formed from a resin film may be provided to keep the distance between the cover member 704 and the substrate 710. The seal member is preferably an epoxy resin. Desirably, the material of the seal member is one that allows as small amount of moisture and oxygen as possible to transmit.

In this embodiment, a glass substrate or a quartz substrate is used as the cover member 704. Alternatively, the cover member may be a plastic substrate that is formed of FRP (fiberglass-reinforced plastics), PVF (polyvinyl fluoride), Mylar, polyester, acrylic, or the like.

After the cover member 704 is bonded to the substrate 710 using the seal pattern 705, the side faces (exposed faces) of the device may be further covered and sealed by the seal pattern (seal member).

The transparent conductive film 718, the transparent conductive resin 707, and the conductors 720 are together called an upper electrode 725. Completed through the above-mentioned steps is a light emitting element 719 that is composed of the upper electrode 725, the organic compound layer 717, and the lower electrode 712.

The light emitting device of the present invention can lower the resistance of the transparent conductive film 718 by forming the conductors 720 that are electrically connected to the transparent conductive film 718.

Since the opening is formed between the conductors 720, light emitted from the organic compound layer 717 can reach outside through the opening 724. As a result, the light emitting element can emit light upward. The material of the lower electrode 712 of the light emitting element is not limited to a transparent material, and therefore a choice of materials that can be used for the lower electrode 7112 is widened.

The present invention employs a sealing method in which the contact between the organic compound layer 717 and oxygen or moisture is avoided by forming the transparent conductive resin 707 between the transparent conductive film 718 and the conductors 720. Accordingly, there is no need to provide a space filled with inert gas, making it possible to reduce the thickness of the light emitting device greatly.

The structure of this embodiment can be employed when any of the light emitting elements that are structured in accordance with Embodiments 1 through 3 is sealed to obtain a light emitting device.

Figure 9:
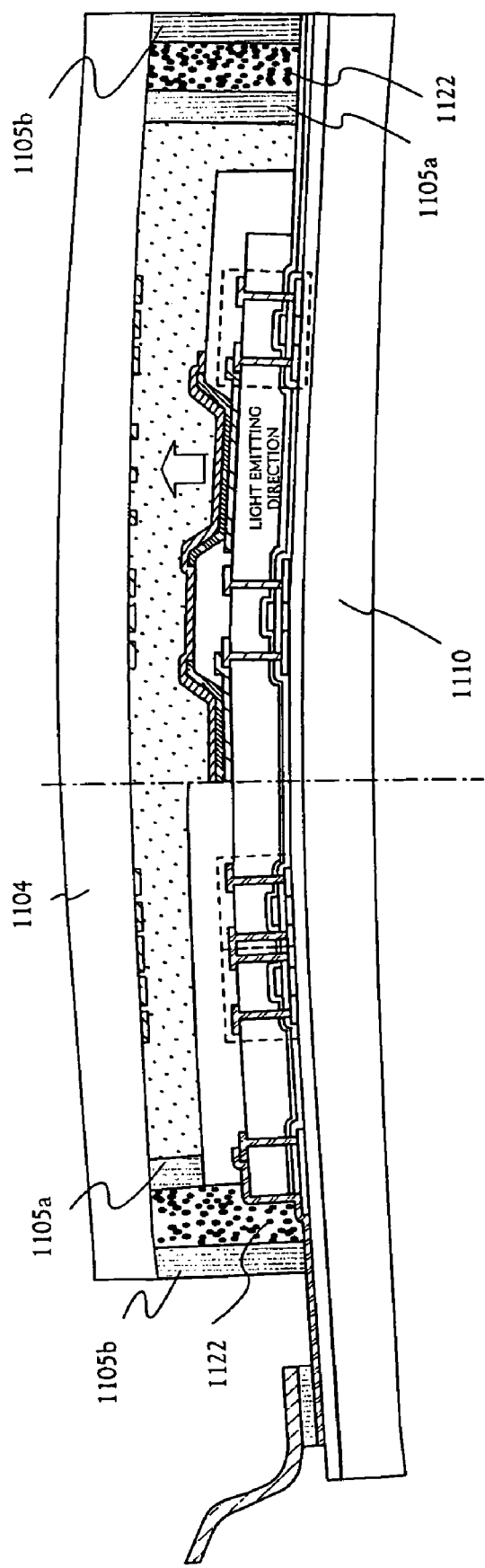
FIG. 9 is a diagram showing the sectional structure of a light emitting device of Embodiment 4.

This embodiment uses glass substrates for the substrate 710 and the cover member 704. However, as shown in FIG. 9, flexible films formed from an organic resin may be used for a substrate 1110 and a cover member 1104. If flexible films are employed, the substrate 1110 and the cover member 1104 can be curved. A TFT may be formed on a glass substrate to be transferred to a flexible film. In the embodiment of the present invention which is illustrated in FIGS. 8A and 8B, the drying agent 722 is placed above the source signal line driving circuit 701 in order to allow the organic compound layer to emit light upward. In the embodiment of the present invention which is illustrated in FIG. 9, a drying agent 1122 may be placed outside a seal pattern 1105a. Alternatively, a sealing pattern 1105b may be placed outside the drying agent 1122. Of the substrate and cover member, one may be a glass substrate while the other is formed from a flexible film.

Embodiment 5

Figure 10A:
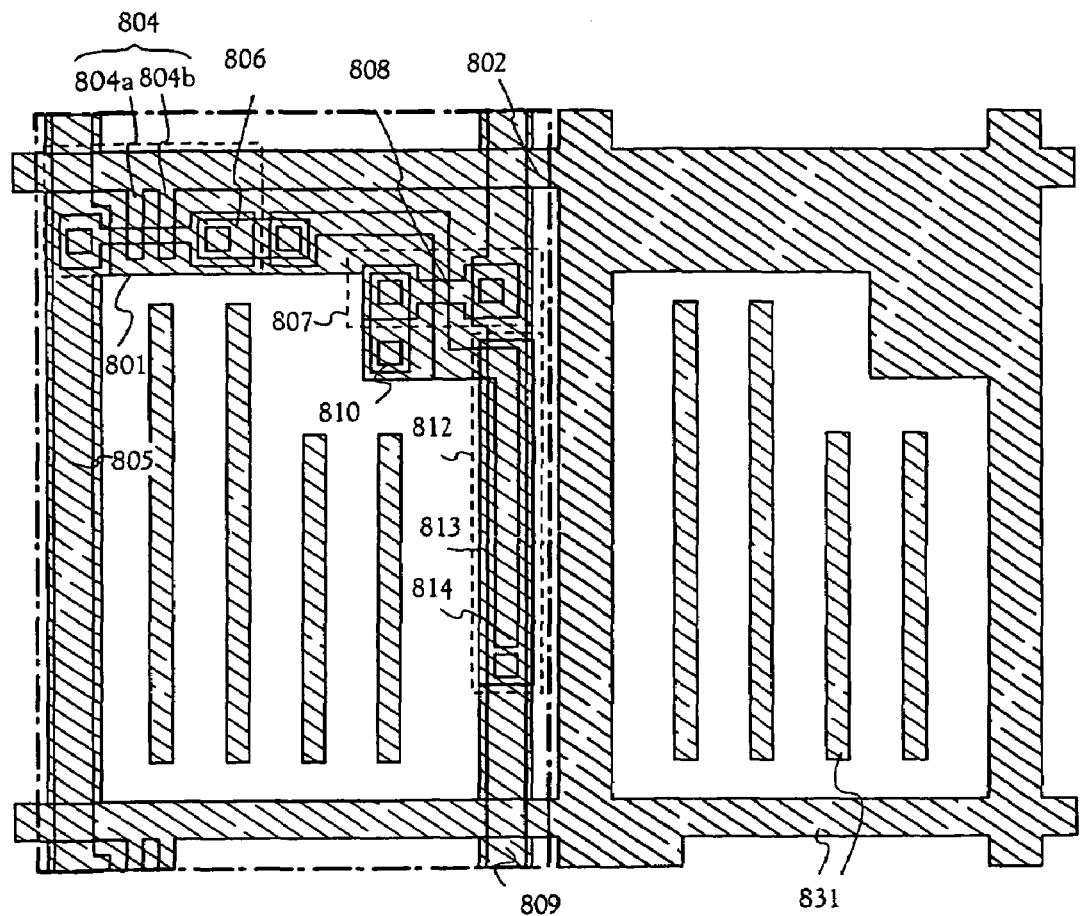
FIGS. 10A and 10B are diagrams showing the top structure of a light emitting device and the circuit structure thereof of Embodiment 5.
Figure 10B:
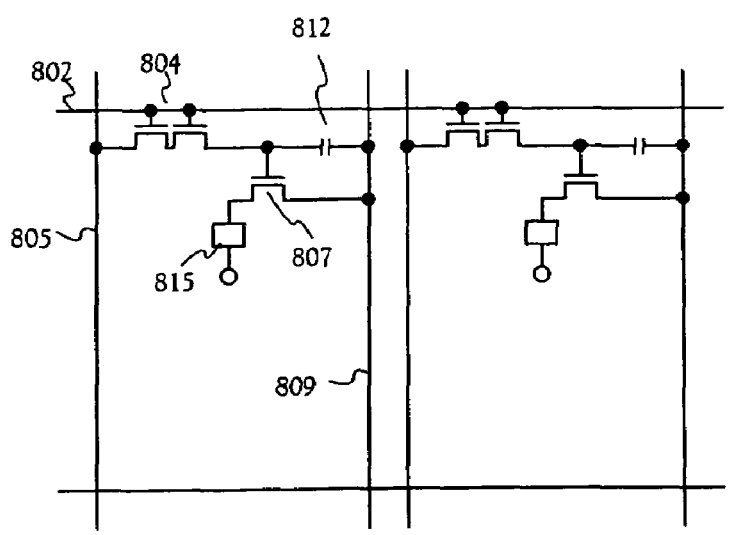

A description is given with reference to FIG. 10A on the top view of a pixel of a light emitting device according to the present invention. The circuit structure in FIG. 10A is shown in FIG. 10B.

In FIG. 10A, reference symbol 801 denotes a switching TFT, which is a p-channel TFT. A wiring line denoted by 802 is a gate wiring line that is electrically connected to gate electrodes 804 (804a and 804b) of the switching TFT 801.

In this embodiment, the switching TFT has a double gate structure in which two channel formation regions are formed. However, a single gate structure in which one channel formation region is formed or a triple gate structure in which three channel formation regions are formed may be employed instead.

A source of the switching TFT 801 is connected to a source wiring line 805. A drain of the switching TFT 801 is connected to a drain wiring line 806. The drain wiring line 806 is electrically connected to a gate electrode 808 of a current controlling TFT 807. The current controlling TFT 807 is an n-channel TFT.

In this embodiment, the switching TFT 801 is a p-channel TFT and the current controlling TFT 807 is an n-channel TFT. Alternatively, an n-channel TFT may be used for the switching TFT 801 while a p-channel TFT is used for the current controlling TFT 807, or TFTs 801 and 807 may be both n-channel TFTs, or TFTs 801 and 807 may be both p-channel TFTs.

A source of the current controlling TFT 807 is electrically connected to a current supplying line 809. A drain of the current controlling TFT 807 is electrically connected to a drain wiring line 810. The drain wiring line 810 is also electrically connected to a lower electrode (not shown in the drawing). An organic compound layer is formed on a transparent conductive film (not shown in the drawing) and conductors 831 are formed thereon to complete a light emitting, element 815 shown in FIG. 8B.

A storage capacitor (capacitor) is formed in a region denoted by 812. The storage capacitor 812 is formed among the current supplying line 809, a semiconductor layer 813, an insulating film (not shown in the drawing) on the same layer as a gate insulating film, and a capacitance electrode 814. The capacitance electrode 814 is electrically connected to the gate electrode 808. A capacitor composed of the capacitance electrode 814, the same layer (not shown) as an interlayer insulating film, and the current supplying line 809 can also be used as a storage capacitor.

The conductors are formed above the gate wiring line 802, above the gate electrodes 804 (804a and 804b), above the gate electrode 808, above the source wiring line 805, above the drain wiring line 810, above the current supplying line 809, and in the pixel.

The conductors are placed in one of the following positions: above the gate wiring line 802, above the gate electrodes 804 (804a and 804b), above the gate electrode 808, above the source wiring line 805, above the drain wiring line 810, above the current supplying line 809, and in the pixel, while interposing an insulating film therebetween. This arrangement is effective in lowering the resistance of the transparent conductive film.

The pixel portion structure described in this embodiment can replace the pixel portion structure of Embodiment Mode.

Embodiment 6

This embodiment describes a case of forming a high molecular weight hole generating layer from a high molecular weight material and an electron acceptor. This embodiment is identical with the above-mentioned Embodiment Mode except the materials of the hole generating layer and the method of forming the hole generating layer.

As the polymeric material for forming the hole-generating layer, polyacetylenes, polythiophenes, poly(3-methyl) thiophenes, poly(3-ethyl)thiophenes, poly(3-n-butyl) thiophenes, poly(3-hexyl) thiophenes, poly(3-octyl) thiophenes, poly(3-dodecyl)thiophenes, poly(3-octadecyl) thiophenes, poly(3-eicosyl)thiophenes, poly(3-methyl-Co-butyl)thiophenes, or the like, which is a conjugated polymeric material, can be used. The hole-generating layer is formed by dissolving or dispersing in the solvent the above-mentioned polymeric material together with the dopant such as PF6-, bromine and iodine.

Furthermore, poly(3-hexyl)thiophenes, poly(3-octyl) thiophenes, poly(3-dodecyl)thiophenes, poly(3-octadecyl) thiophenes, poly(3-eicosyl)thiophenes and poly(3-methyl-Co-butyl)thiophenes are soluble. As the solvent, chloroform, benzene, tetralin, or the like can be used.

In this embodiment, a hole generating layer 504 with a thickness of 10 to 50 nm (preferably 20 to 30 nm) is formed on a lower electrode 501 shown in FIG. 6. The hole generating layer 504 is formed from a soluble material by printing or by the ink jet method.

Alternatively, the hole generating layer 504 may be formed by spin coating. In this case, the hole generating layer 504 is shared by adjacent electrodes, and therefore the distance between the adjacent electrodes has to be large to increase the resistance thereof. The resistance of the adjacent electrodes (anodes) has to be set to $\frac{1}{10}$ or more of the resistance between electrodes (cathodes) that face the anodes.

An organic compound layer 509 is formed on the hole generating layer 504. The organic compound layer 509 is a combination of a hole injection layer 505, a hole transporting layer 506, a light emitting layer 507, and an electron transporting layer 508. In this embodiment, known materials are used to form the hole injection layer, the hole transporting layer, the light emitting layer, and the electron transporting layer.

After the organic compound layer 509 is formed in this way, an ITO film is formed as a transparent conductive film 510 on the organic compound layer 509.

Conductors 511 are formed on a cover member (not shown in the drawing) and an opening 512 is formed in the cover member. The conductors 511 formed on the cover member (not shown) are bonded to the transparent conductive film 510 in vacuum with a transparent conductive resin 513 sandwiched therebetween.

In the light emitting device of the present invention, the organic compound layer 509 having a laminate structure is formed between the transparent conductive film 510 and the conductors 511, and the same material is used to form the hole generating layer 504 and the hole injection layer 505.

The transparent conductive resin 513 is formed on the transparent conductive film 510. The conductors 511 and the opening 512 are formed on the transparent conductive resin 513. In this specification, the conductors 511, the transparent conductive resin 513, and the transparent conductive film 510 are together called an upper electrode 514. The light is emitted in the direction indicated by the arrow in FIG. 6.

Thus completed is a light emitting element composed of the lower electrode 501, the organic compound layer 509, and the upper electrode 514.

The light emitting device of the present invention can lower the resistance of the transparent conductive film 510 by forming the conductors 511 that are electrically connected to the transparent conductive film 510.

Transparent and conductive materials are employed for the transparent conductive film 510 and the transparent conductive resin 513, and the opening 512 is provided between adjacent conductors. Therefore, light emitted from the organic compound layer 509 can reach outside through the opening 512. This allows the organic compound layer to emit light upward. A light-shielding material may be employed for the lower electrode 501.

The present invention employs a sealing method in which the contact between the organic compound layer 509 and oxygen or moisture is avoided by forming the transparent conductive resin 513 between the transparent conductive film 510 and the conductors 511. Accordingly, there is no need to provide a space filled with inert gas, making it possible to reduce the thickness of the light emitting device greatly.

The lower electrode 501 serves as an anode and the upper electrode 514 serves as a cathode in this embodiment, but the present invention is not limited thereto. The lower electrode 501 can be a cathode whereas the upper electrode 514 serves as an anode. In this case, the electron transporting layer, tight emitting layer, hole transporting layer, hole injection layer, and hole generating layer of the organic compound layer are layered in this order with the electron transporting layer being the closest to the lower electrode.

The structure of this embodiment may be combined with any of the structures of Embodiments 1 through 6.

Embodiment 7

Figure 11:
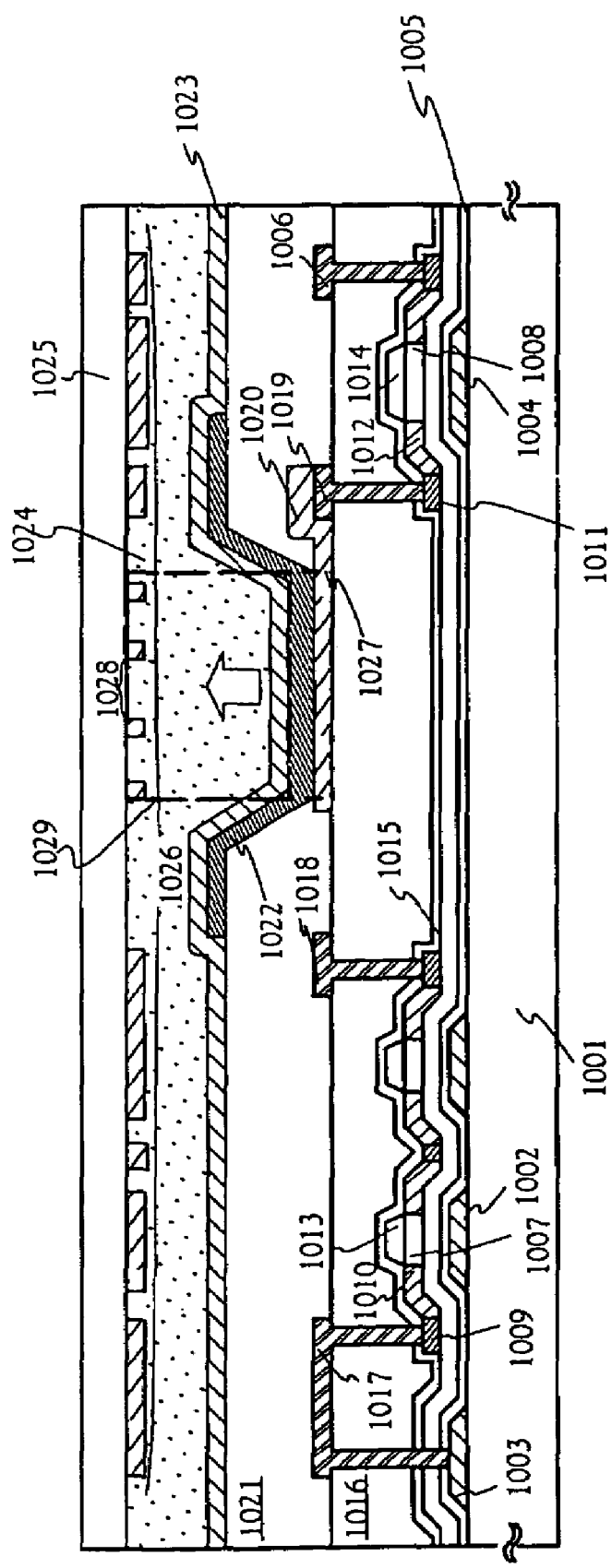
FIG. 11 is a diagram showing the sectional structure of a light emitting device of Embodiment 7.

A description is given with reference to FIG. 11 on an example of applying the present invention to TFTs that are structured differently from the TFTs of Embodiment 4.

Reference symbol 1001 denotes a substrate; 1002, a gate electrode; 1003, a source wiring line; 1004, a capacitance wiring line; and 1005, a first insulating film. 1006 denotes a source wiring line; 1007 and 1008, channel formation regions; 1009, a source or drain region; and 1010, an LDD region. 1011 denotes a drain region; 1012, an LDD region; 1013 and 1014, third insulating films; and 1015, a fourth insulating film. 1016 denotes a first interlayer insulating film, 1017, a connection wiring line; 1018, a source or drain wiring line; 1019, a drain wiring line; and 1020, a lower electrode. 1021 denotes a second interlayer insulating film; 1022, an organic compound layer; 1023, a transparent conductive film; 1024, a transparent conductive resin; and 1025, a cover member. 1026 denotes conductors; 1027, a light emitting element; and 1028, an opening. The arrow in FIG. 11 indicates the direction of light emitted from the organic compound layer 1022.

In this specification, the conductors 1026, the transparent conductive resin 1024, and the transparent conductive film 1023 are together called an upper electrode 1029. The lower electrode 1020, the organic compound layer 1022, and the upper electrode 1029 constitute the light emitting element 1027.

The light emitting device of this embodiment can lower the resistance of the transparent conductive film 1023 by forming the conductors 1026 that are electrically connected to the transparent conductive film 1023.

Since the opening 1028 is provided between adjacent conductors, light emitted from the organic compound layer 1022 can reach outside through the opening 1028. This allows the organic compound layer to emit light upward. The conductors 1026 of the light emitting element 1027 therefore do not need to be transparent, which widens a choice of materials of the electrodes.

The present invention employs a sealing method in which the contact between the organic compound layer 1022 and oxygen or moisture is avoided by forming the transparent conductive resin 1024 between the transparent conductive film 1023 and the conductors 1026 Accordingly, there is no need to provide a space filled with inert gas, making it possible to reduce the thickness of the light emitting device greatly.

Embodiment 8

The present invention can be applied to a passive-type light emitting device. A description is made of an example of applying the present invention to the passive-type light emitting device with reference to FIG. 12.

Reference symbol 900 denotes a substrate; 901, a light emitting element; 902, an upper electrode; 903, a first insulating film; 904, a second insulating film; 905, a seal pattern; 906 a transparent conductive resin; 907, a lower electrode; 908, an organic compound layer; 909, a transparent conductive film; 910, a third insulating film; 911, a fourth insulating film; 912, a cover material; 913, conductors; 914, opening portion; and 915, partition wall. The arrow indicates the direction of light emitted from the organic compound layer 908.

Figure 12:
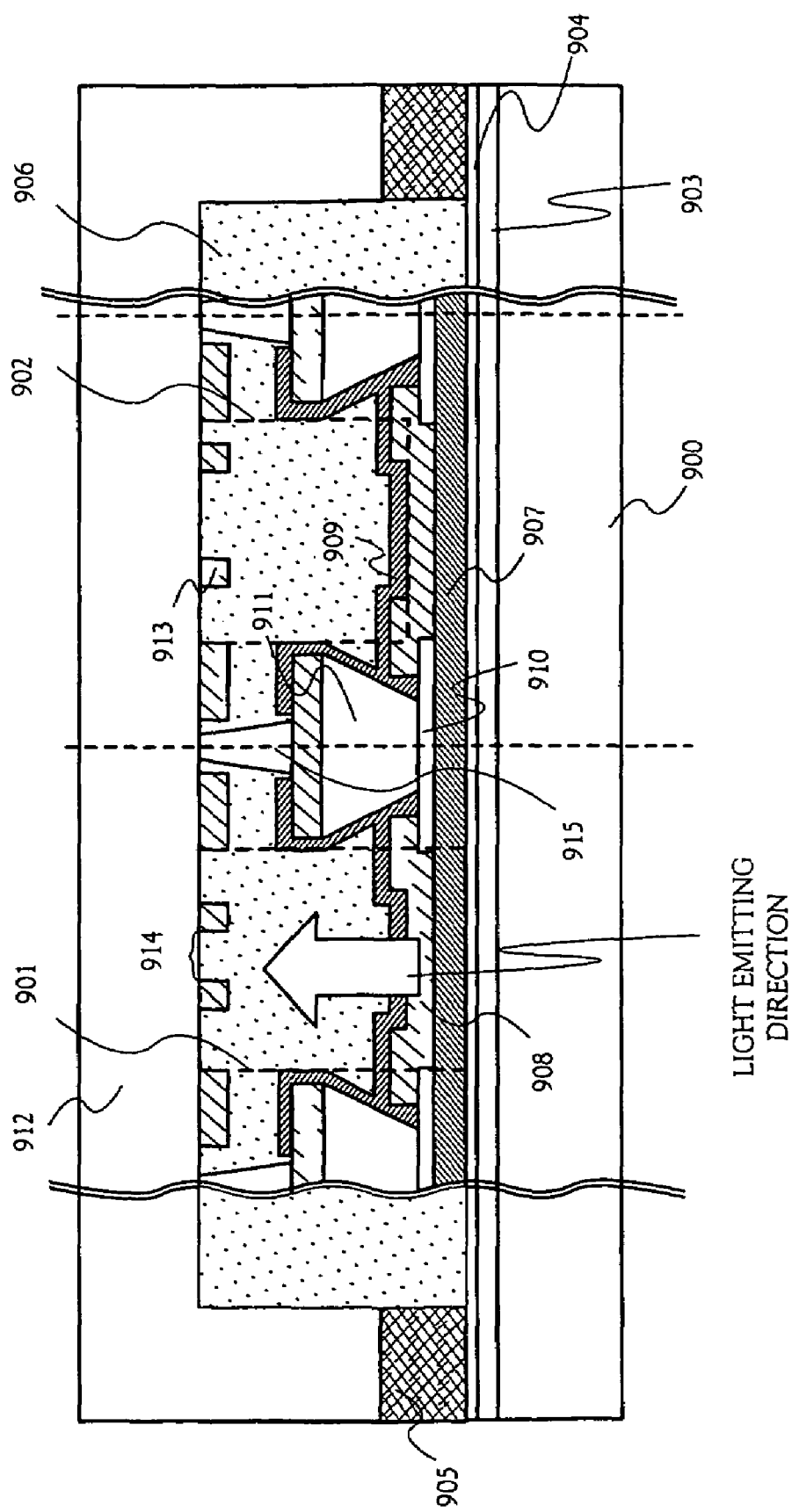
FIG. 12 is a diagram showing the sectional structure of a light emitting device of Embodiment 8.

The partition walls 915 are patterned into a desired shape by photolithography at given positions. The material of the partition walls is NN700 (a product of JSR Corporation) having a photosensitive acrylic material as its main ingredient. NN700 is applied by a spinner to the entire surface of the cover member 912 on which the conductors 913 are formed. The thickness of the NN700 film is set to 1.4 µm. After applying and calcinating NN700, the NN700 film is exposed using a photo mask and a mask aligner. Thereafter the film is developed with a developer mainly containing TMAH (tetramethyl ammonium hydroxide). The substrate is let dry and then subjected to baking at 250° C. for an hour. As a result, partition walls for insulating adjacent light emitting elements from each other are obtained as shown in FIG. 12. The height of each partition wall is 1.2 µm after the baking.

The transparent conductive resin 906 may be formed by application or injection, or by the ink jet method.

In this specification, the conductors 913, the transparent conductive resin 906, and the transparent conductive film 909 are together called an upper electrode 902. The light is emitted in the direction indicated by the arrow in FIG. 12. Thus completed is a light emitting element 901 composed of the lower electrode 907, the organic compound layer 908, and the upper electrode 902.

Further, the light emitting device of this embodiment can lower the resistance of the transparent conductive film 909 by forming the conductors 913 that are electrically connected to the transparent conductive film 909.

Since the opening 914 is provided between adjacent conductors, light emitted from the organic compound layer 908 can reach outside through the opening 914. This allows the organic compound layer to emit light upward. The conductors 913 of the light emitting element 901 therefore do not need to be transparent, which widens a choice of materials of the electrodes.

The present invention employs a sealing method in which the contact between the organic compound layer 908 and oxygen or moisture is avoided by forming the transparent conductive resin 906 between the transparent conductive film 909 and the conductors 913. Accordingly, there is no need to provide a space filled with inert gas, making it possible to reduce the thickness of the light emitting device greatly.

Embodiment 9

Light emitting devices with light emitting elements are self-luminous and therefore have superior visibility in bright surroundings as well as wider viewing angle compared to liquid crystal display devices. Accordingly, light emitting devices with light emitting elements can be used in display units of various electric apparatuses.

An electric apparatus using a light emitting device that is manufactured in accordance with the present invention can be a video camera, a digital camera, a goggle type display (head mounted display), a navigation system, an audio replaying device (such as a car audio system and an audio component), a notebook computer, a game machine, a portable information terminal (such as a mobile computer, a cellular phone, a portable game machine, and an electronic book), an image reproducing device provided with a recording medium (specifically, a device having a display device capable of displaying an image that is retrieved from a recording medium such as a DVD (digital versatile disc)), etc. Light emitting devices with light emitting elements are particularly preferred in portable information terminals of which screens are often slanted when viewed and therefore required to have wide viewing angle. Specific examples of these electric appliances are shown in FIGS. 13A to 13H.

Figure 13A:
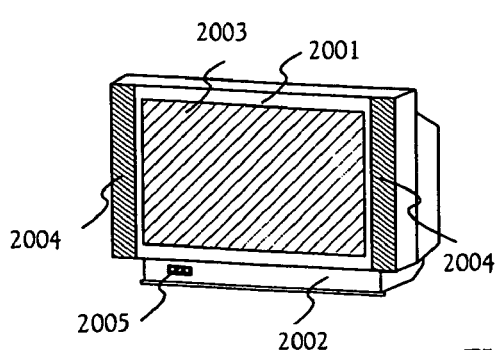
FIGS. 13A to 13H are diagrams showing examples of electric apparatus of Embodiment 9.

FIG. 13A shows a display device, which is composed of a case 2001, a supporting base 2002, a display unit 2003, speaker units 2004, a video input terminal 2005, etc. The light emitting device manufactured in accordance with the present invention can be used as the display unit 2003. Light emitting devices with light emitting elements are self-luminous and do not need back light, thereby making it possible to obtain thinner display units than those utilizing liquid crystal display devices. The term display device includes all display devices for displaying information, such as personal computer monitors, display devices for receiving TV broadcasting, and display devices for advertising.

Figure 13B:
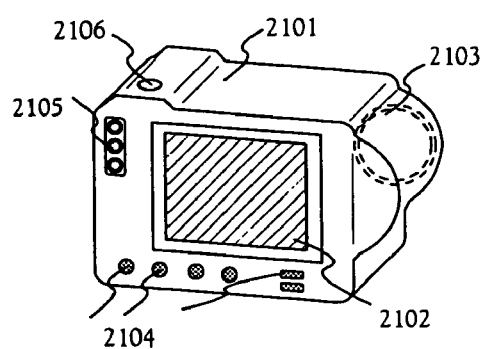

FIG. 13B shows a digital still camera, which is composed of a main body 2101, a display portion 2102, an image receiving portion 2103, an operation key 2104, an outer connection port 2105, a shutter 2106 etc. The light emitting device manufactured in accordance with the present invention can be used as the display unit 2102.

Figure 13C:
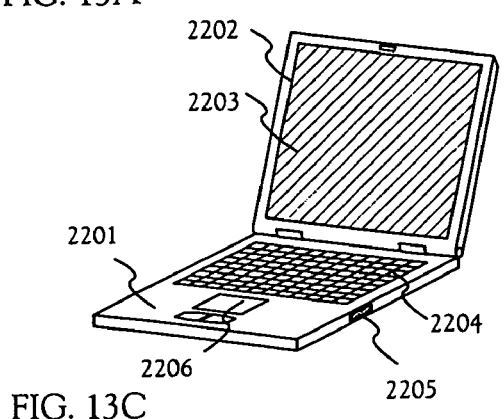

FIG. 13C shows a notebook computer, which is composed of a main body 2201, a case 2202, a display portion 2203, a keyboard 2204, an outer connection port 2205, a pointing mouse 2206 etc. The light emitting device manufactured in accordance with the present invention can be used as the display unit 2203.

Figure 13D:
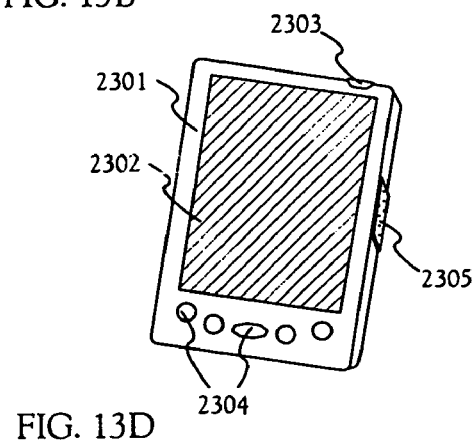

FIG. 13D shows a mobile computer, which is composed of a main body 2301, a display portion 2302, a switch 2303, an operation key 2304, an infrared port 2305 etc. The light emitting device manufactured in accordance with the present invention can be used as the display unit 2302.

Figure 13E:
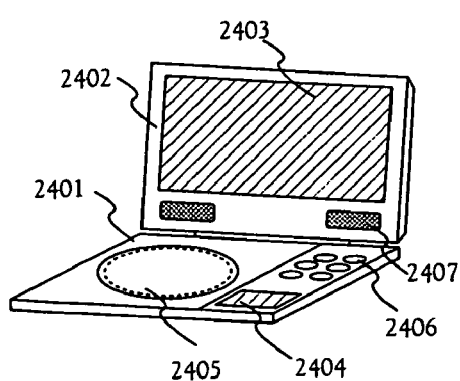

FIG. 13E shows a portable image reproducing device provided with a recording medium (specifically, a DVD player). The device is composed of a main body 2401, a case 2402, a display unit A 2403, a display unit B 2404, a recording medium (DVD etc.) reading unit 2405, operation keys 2406, speaker units 2407, etc. The display unit A 2403 mainly displays image information whereas the display unit B 2404 mainly displays text information. The light emitting device manufactured in accordance with the present invention can be used for the display unit A 2403 and the display unit B 2404 both. An image reproducing device provided with a recording medium includes a household game machine.

Figure 13F:
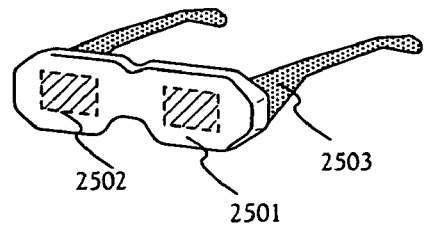

FIG. 13F shows a goggle-type display (head mount display), which is composed of a main body 2501, a display portion 2502, and an arm portion 2503. The light emitting device manufactured in accordance with the present invention can be used as the display unit 2502.

Figure 13G:
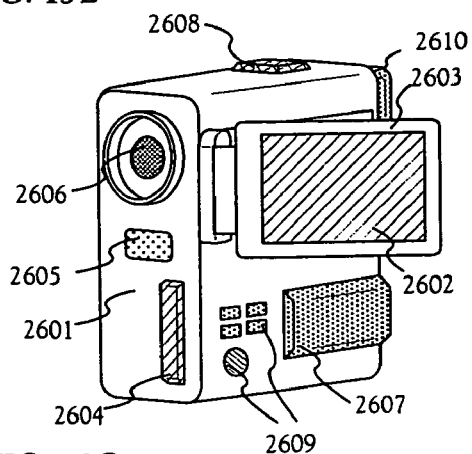

FIG. 13G shows a video camera, which is composed of a main body 2601, a display portion 2602, a case 2603, an outer connection port 2604, a remote control receiving portion 2605, an image receiving portion 2606, a battery 2607, an audio input portion 2608, an operation key 2609, an eye piece portion 2610, etc. The light emitting device manufactured in accordance with the present invention can be used as the display unit 2602.

Figure 13H:
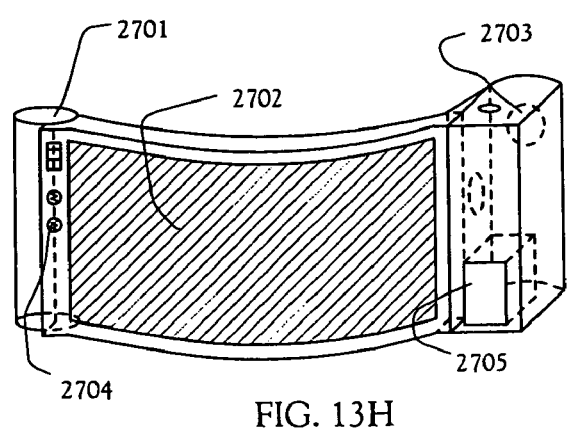

FIG. 13H shows a portable image taking display apparatus, which is composed of a main body 2701, a display portion 2702, an image receiving portion 2703, an operation switch 2704, a battery 2705, etc. The light emitting device manufactured in accordance with the present invention, especially shown FIG. 9 can be used as the display unit 2702. Being curved itself, the light emitting device of the present invention can be effectively built in a three-dimensionally curved electric apparatus that is designed on the basis of ergonomics.

If the luminance of light emitted from an organic material is raised in future, the light emitting device can be used in a front or rear projector by magnifying and projecting outputted light that contains image information with a lens etc.

Electric apparatuses as those given in the above-mentioned now display information distributed through Internet, CATV (cable television), and other electronic communication lines, animation information, in particular, with increasing frequency. Organic materials have very fast response speed and therefore light emitting devices are preferable modes for displaying animated images.

When displaying information on a light emitting device, it is preferred to allow as small number of pixels as possible to emit light because the light emitting device consumes more power as the number of emitting pixels is increased. Therefore, if a light emitting device is used in a display unit that mainly displays text information such as a portable information terminal, particularly a cellular phone or an audio replaying device, the display device is preferably driven so that pixels emitting light form text information white pixels that are not emitting light form the background on the screen.

As described above, the light emitting device manufactured in accordance with the present invention has a very wide application range and is applicable to electric appliances of every field. The electric appliances of this embodiment can employ as their display units the light emitting devices manufactured in Embodiments 1 through 8.

The present invention can provide a light emitting device having a low-resistant conductive film by forming an electrode from a transparent conductive film, a transparent conductive resin, and conductors.

The transparent conductive film and the transparent conductive resin are transparent and have conductivity, and an opening is provided between adjacent conductors. Therefore light emitted from the organic compound layer can reach outside through the opening. This allows the organic compound layer to emit light upward. A light-shielding material may be employed for the lower electrode.

The present invention employs a sealing method in which the contact between the organic compound layer and oxygen or moisture is avoided by forming the transparent conductive resin between the transparent conductive film and the conductors. Accordingly there is no need to provide a space filled with inert gas, making it possible to reduce the thickness of the light emitting device greatly.

What is claimed is:

1. A method of manufacturing a light emitting device, said method comprising:
    forming an organic compound layer over a first surface of a substrate;
    forming a transparent conductive resin over the organic compound layer;
    forming at least a conductor over a second surface of a cover member;
    opposing the first surface of the substrate and the second surface of the cover member; and
    bonding the substrate and the cover member with a seal pattern.

2. A method according to claim 1,
    wherein the light emitting device is in combination with an electric apparatus,
    wherein the electric apparatus is one selected from the group consisting of a display device, a digital still camera, a notebook computer, a mobile computer, a portable image reproducing device provided with a recording medium, a goggle-type display, a video camera, a portable image taking display apparatus.

3. A method according to claim 1, wherein the cover member is a substrate selected from the group consisting of a glass substrate, a quarts substrate and a plastic substrate formed of FRP (fiberglass-reinforced plastic), PVF (polyvinyl fluoride), Mylar, polyester, or acrylic.

4. A method according to claim 1, wherein the cover member has a depression; and a drying agent is sealed in the depression.

5. A method of manufacturing a light emitting device, said method comprising:
    forming an organic compound layer over a first surface of a substrate;
    forming at least a conductor over a second surface of a cover member;
    forming a seal pattern along end portions of the cover member;
    forming a transparent conductive resin inside the seal pattern over the cover member;
    opposing the first surface of the substrate and the second surface of the cover member;
    bonding the substrate and the cover member with the seal pattern.

6. A method according to claim 5,
    wherein the light emitting device is in combination with an electric apparatus,
    wherein the electric apparatus is one selected from the group consisting of a display device, a digital still camera, a notebook computer, a mobile computer, a portable image reproducing device provided with a recording medium, a goggle-type display, a video camera, a portable image taking display apparatus.

7. A method according to claim 5, wherein the cover member is a substrate selected from the group consisting of a glass substrate, a quarts substrate and a plastic substrate formed of FRP (fiberglass-reinforced plastic), PVF (polyvinyl fluoride), Mylar, polyester, or acrylic.

8. A method according to claim 5, wherein the cover member has a depression; and a drying agent is sealed in the depression.

9. A method according to claim 5, wherein the transparent conductive resin comprises a material selected from the group consisting of polypyrrole, polyaniline, polythiophene, poly(3, 4-ethylene dioxythiophene), polyisothianaphthene, polyacetylene, tetracyanoquinodimethane, a polyvinyl chloride composition, and a high molecular weight material mainly containing an aromatic amine polymer.

10. A method of manufacturing a light emitting device, said method comprising:
forming an electrode over a substrate;
forming first and second insulating films over the electrode;
forming an organic compound layer between the first and second insulating films, over the substrate;
forming a transparent conductive resin over the first and second insulating films and the organic compound layer;
forming at least a conductor over a cover member; and
bonding the substrate and cover member with a seal pattern.

11. A method according to claim 10,
wherein the light emitting device is in combination with an electric apparatus,
wherein the electric apparatus is one selected from the group consisting of a display device, a digital still camera, a notebook computer, a mobile computer, a portable image reproducing device provided with a recording medium, a goggle-type display, a video camera, a portable image taking display apparatus.

12. A method according to claim 10, wherein the cover member is a substrate selected from the group consisting of a glass substrate, a quarts substrate and a plastic substrate formed of FRP (fiberglass-reinforced plastic), PVF (polyvinyl fluoride), Mylar, polyester, or acrylic.

13. A method according to claim 10, wherein the cover member has a depression; and a drying agent is sealed in the depression.

14. A method according to claim 10, wherein the transparent conductive resin comprises a material selected from the group consisting of polypyrrole, polyaniline, polythiophene, poly(3, 4-ethylene dioxythiophene), polyisothianaphthene, polyacetylene, tetracyanoquinodimethane, a polyvinyl chloride composition, and a high molecular weight material mainly containing an aromatic amine polymer.

15. A method according to claim 10, further comprising a step of forming a transparent conductive film covering the organic compound layer and side surfaces of first and second insulating films.

16. A method according to claim 10, further comprising a step of forming a partition wall over each of the first and second insulating films.

17. A method of manufacturing a light emitting device, said method comprising:
forming an electrode over a substrate;
forming first and second insulating films over the electrode;
forming an organic compound layer between the first and second insulating films, over the substrate;
forming a transparent conductive resin over the first and second insulating films and the organic compound layer;
forming at least a conductor over a cover member;
forming a seal pattern along end portions of the cover member;
forming a transparent conductive resin inside the seal pattern over the cover member; and
bonding the substrate and the cover member with the seal pattern.

18. A method according to claim 17,
wherein the light emitting device is in combination with an electric apparatus,
wherein the electric apparatus is one selected from the group consisting of a display device, a digital still camera, a notebook computer, a mobile computer, a portable image reproducing device provided with a recording medium, a goggle-type display, a video camera, a portable image taking display apparatus.

19. A method according to claim 17, wherein the cover member is a substrate selected from the group consisting of a glass substrate, a quarts substrate and a plastic substrate formed of FRP (fiberglass-reinforced plastic), PVF (polyvinyl fluoride), Mylar, polyester, or acrylic.

20. A method according to claim 17, wherein the cover member has a depression; and a drying agent is sealed in the depression.

21. A method according to claim 17, wherein the transparent conductive resin comprises a material selected from the group consisting of polypyrrole, polyaniline, polythiophene, poly(3, 4-ethylene dioxythiophene), polyisothianaphthene, polyacetylene, tetracyanoquinodimethane, a polyvinyl chloride composition, and a high molecular weight material mainly containing an aromatic amine polymer.

22. A method according to claim 17, further comprising a step of forming a transparent conductive film covering the organic compound layer and side surfaces of first and second insulating films.

23. A method according to claim 17, further comprising a step of forming a partition wall over each of the first and second insulating films.

* * * * *